(12) United States Patent
Tanaka et al.

(10) Patent No.: US 7,872,919 B2
(45) Date of Patent: Jan. 18, 2011

(54) SEMICONDUCTOR MEMORY DEVICE

(75) Inventors: Rieko Tanaka, Yokohama (JP); Koichi Fukuda, Yokohama (JP); Takumi Abe, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 12/493,680

(22) Filed: Jun. 29, 2009

(65) Prior Publication Data

US 2009/0323426 A1    Dec. 31, 2009

(30) Foreign Application Priority Data

Jun. 30, 2008    (JP) .............................. 2008-170968

(51) Int. Cl.
*G11C 16/06* (2006.01)
(52) U.S. Cl. .............................. 365/185.21; 365/185.24; 365/185.18; 365/185.23; 365/185.14; 365/185.03
(58) Field of Classification Search ............ 365/185.24, 365/185.21, 185.18, 185.23, 185.14, 185.13, 365/185.03
See application file for complete search history.

(56) References Cited

U.S. PATENT DOCUMENTS

| 2006/0034140 A1 | 2/2006 | Ogawa et al. |
| 2008/0130366 A1* | 6/2008 | Ueda et al. ............. 365/185.13 |

FOREIGN PATENT DOCUMENTS

JP          2006-79803          3/2006

* cited by examiner

*Primary Examiner*—Thong Q Le
(74) *Attorney, Agent, or Firm*—Oblon, Spivak, McClelland, Maier & Neustadt, L.L.P.

(57) ABSTRACT

A semiconductor memory device includes a sense amplifier which senses identical multilevel data, which is stored in a memory cell, a plurality of number of times at a time of read, and a n-channel MOS transistor which has a current path one end of which is connected to the sense amplifier and the other end of which is connected to a bit line. The device further include a control unit which applies a first voltage to a gate electrode of the n-channel MOS transistor, thereby setting the n-channel MOS transistor in an ON state, and applies a second voltage which is higher than the first voltage, to the gate electrode during a period after first sense and before second sense.

16 Claims, 11 Drawing Sheets

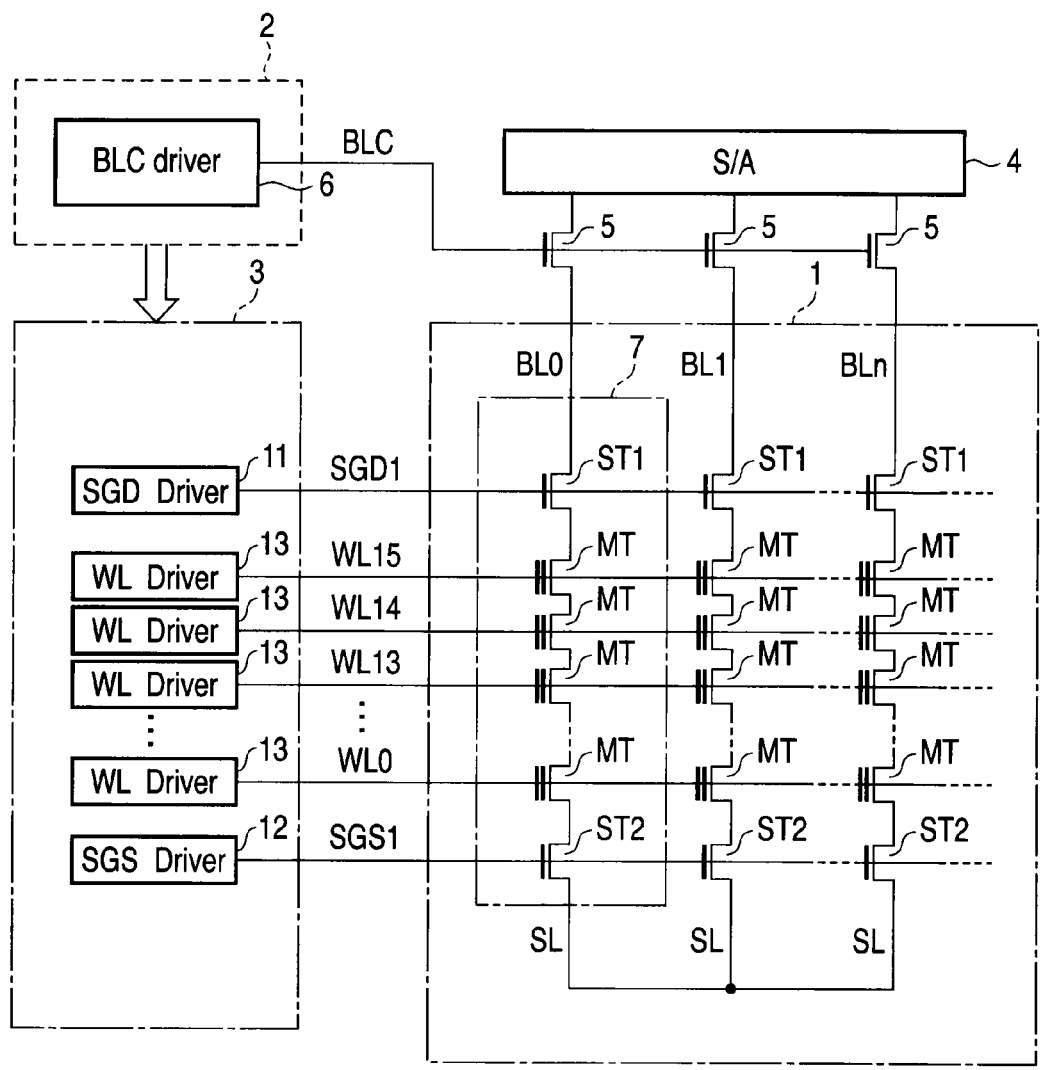
F I G. 1

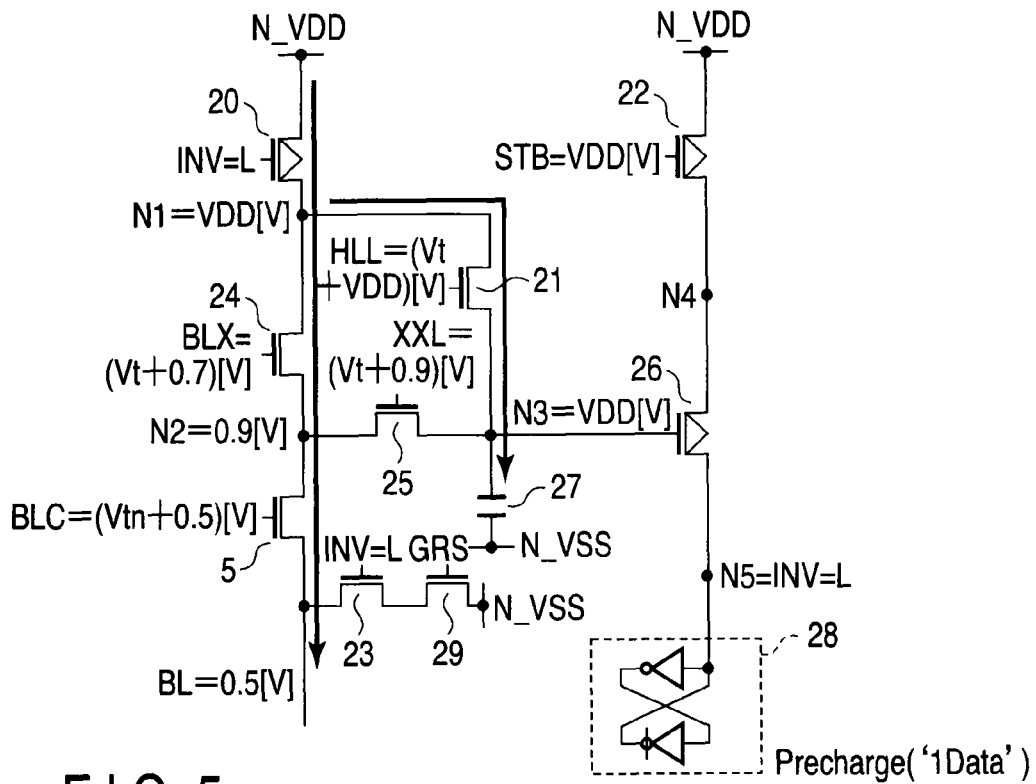
F I G. 5
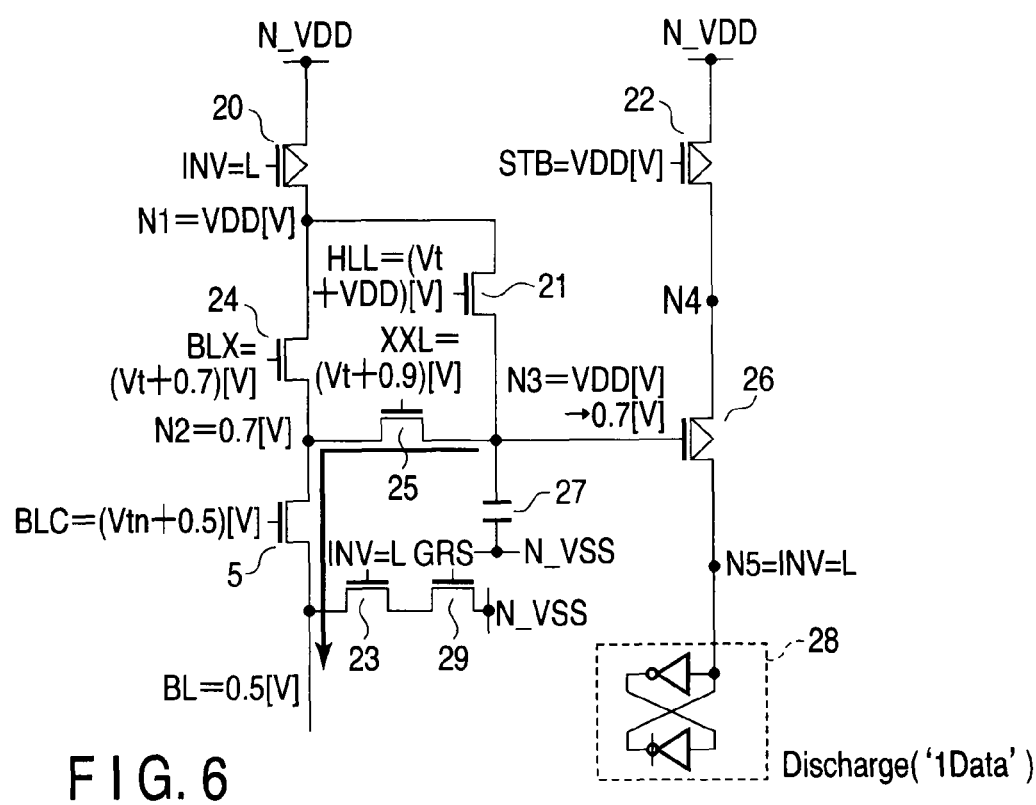
F I G. 6

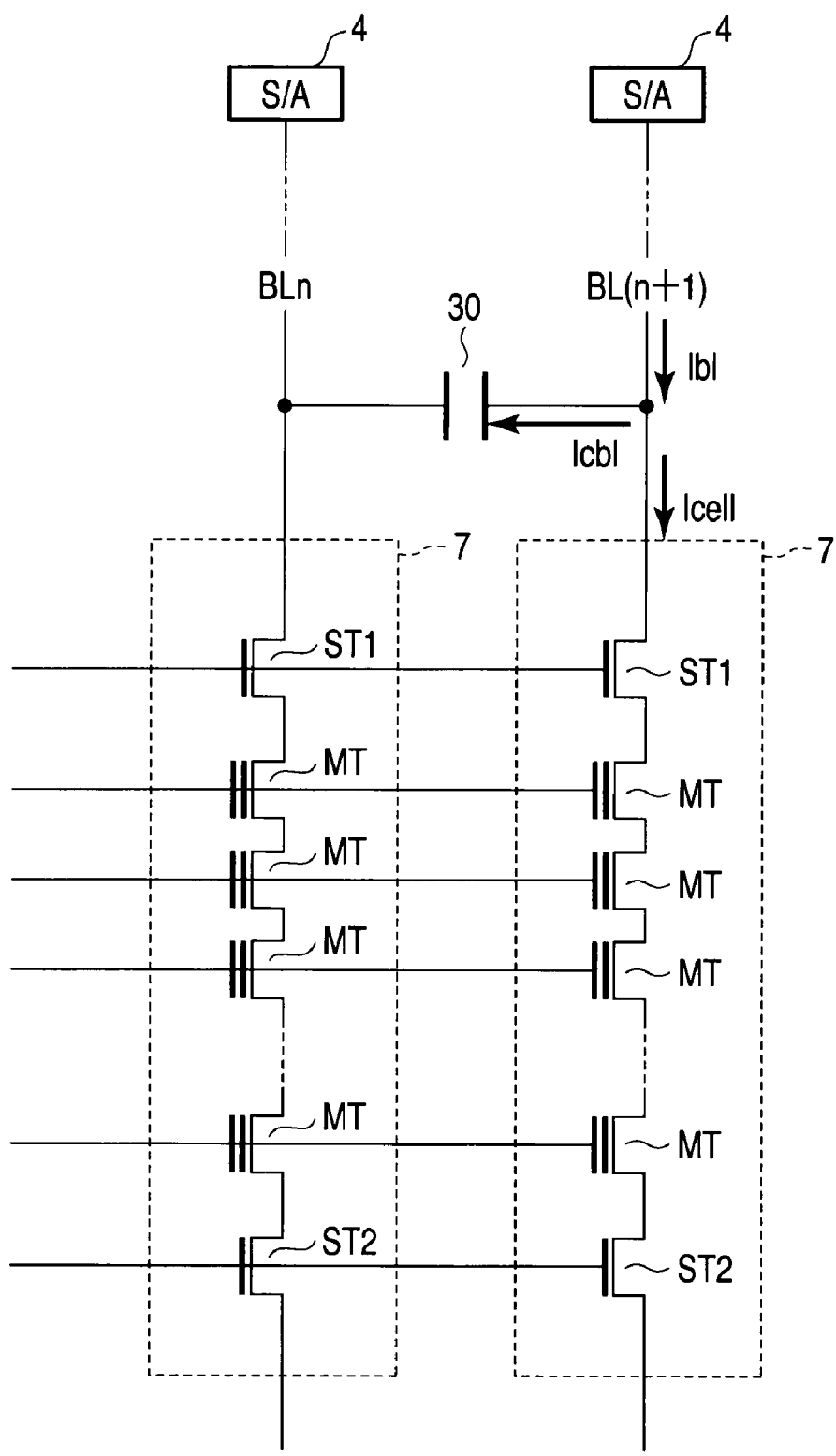
F I G. 12

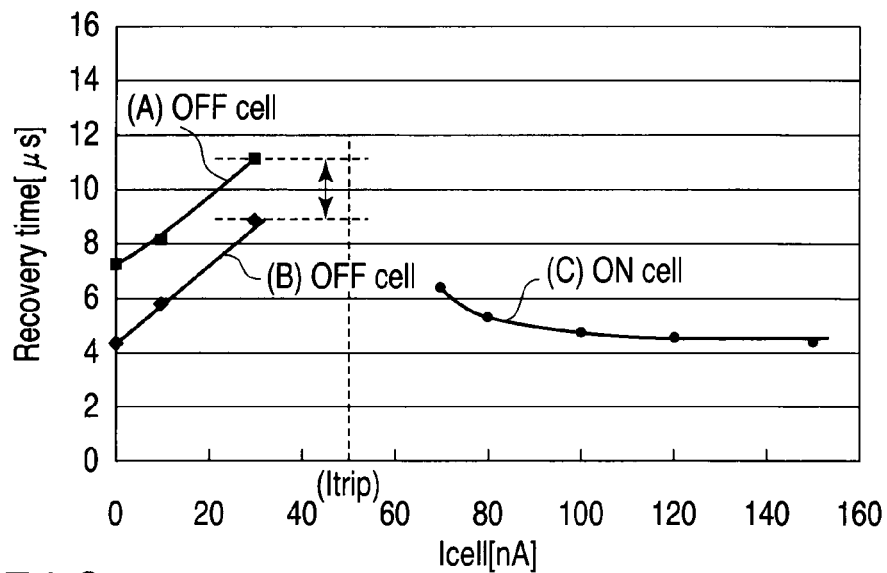
F I G. 15
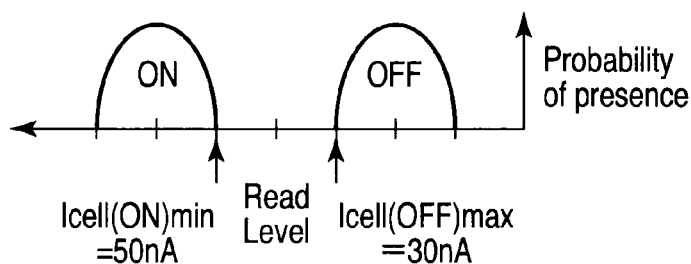
F I G. 16
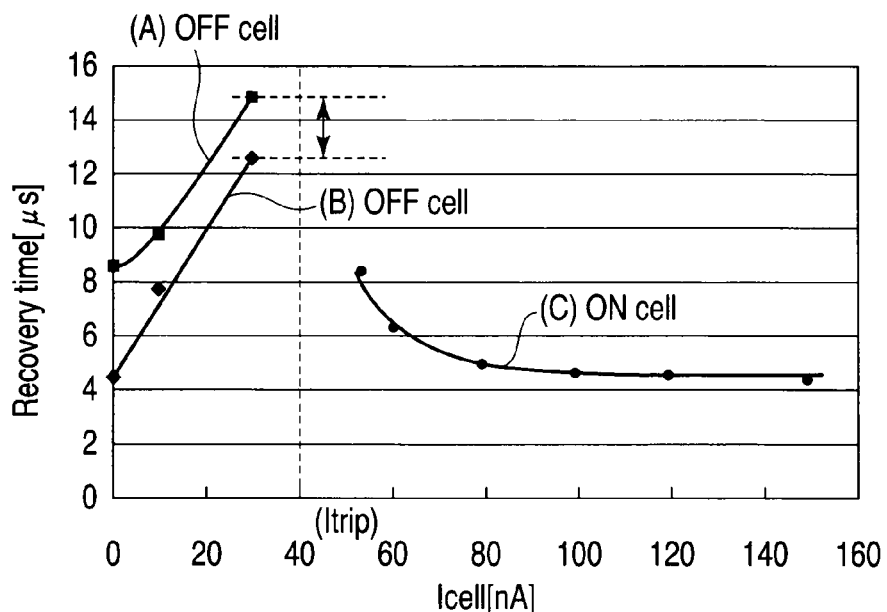
F I G. 17

US 7,872,919 B2

SEMICONDUCTOR MEMORY DEVICE

CROSS-REFERENCE TO RELATED APPLICATIONS

This application is based upon and claims the benefit of priority from prior Japanese Patent Application No. 2008-170968, filed Jun. 30, 2008, the entire contents of which are incorporated herein by reference.

BACKGROUND OF THE INVENTION

1. Field of the Invention

The present invention relates to a semiconductor memory device. The invention relates more particularly to the control of bit lines at a time of a read operation in a NAND flash memory.

2. Description of the Related Art

A NAND flash memory is composed of, for example, a memory cell array, a sense amplifier, and bit lines which electrically connect the memory cell array and the sense amplifier. A plurality of memory cells, each including a charge accumulation layer and a control gate electrode, are disposed in the memory cell array.

In recent years, with an increase in information amount, there has been an increasing demand for the expansion of memory capacity.

This demand has conventionally been met by increasing the number of memory cell arrays. Various methods have been adopted in order to suppress an increase in power consumption due to the expansion of the memory capacity (see, for example, Jpn. Pat. Appln. KOKAI Publication No. 2006-79803).

However, if the demand for the expansion of the memory capacity is to be satisfied while the area of occupation of the NAND flash memory is being kept at a present level, it is necessary to make the memory cells still finer. To make the memory cells finer leads to degradation in characteristics of the memory cells. In addition, long bit lines are required. The increase in length of bit lines leads to an increase in parasitic resistance and parasitic capacitance of bit lines. As a result, there occurs such a problem that the data read speed of the NAND flash memory lowers.

BRIEF SUMMARY OF THE INVENTION

According to a first aspect of the present invention, there is provided a semiconductor memory device comprising: at least one memory cell which includes a charge accumulation layer and a control gate and is capable of storing data of two or more values in accordance threshold values; at least one bit line which is connected to the memory cell; at least one sense amplifier which senses identical data, which is stored in the memory cell, a plurality of number of times at a time of read; at least one n-channel metal oxide semiconductor (MOS) transistor which has a current path one end of which is connected to the sense amplifier and the other end of which is connected to the bit line; and at least one control unit which applies one of a first voltage and a second voltage, which is higher than the first voltage, to a gate electrode of the n-channel MOS transistor, wherein the control unit applies the first voltage to the gate electrode, thereby setting the n-channel MOS transistor in an ON state, and applies the second voltage to the gate electrode during a period after first sense and before second sense.

According to a second aspect of the present invention, there is provided a semiconductor memory device comprising: a plurality of memory cells, each of which includes a charge accumulation layer and a control gate and is capable of storing data of two or more values in accordance threshold values; a plurality of bit lines which are connected to the plurality of memory cells; a plurality of sense amplifiers which are provided on the plurality of bit lines and sense identical data, which is stored in the plurality of memory cells, a plurality of number of times at a time of read; a plurality of n-channel metal oxide semiconductor (MOS) transistors, each of which has a current path one end of which is connected to an associated one of the plurality of sense amplifiers and the other end of which is connected to an associated one of the plurality of bit lines; and one control unit which applies one of a first voltage and a second voltage, which is higher than the first voltage, to gate electrodes of the plurality of n-channel MOS transistors, wherein at a time of a read operation or a verify operation the control unit applies the first voltage to the gate electrodes, thereby setting the plurality of n-channel MOS transistors in an ON state, and applies the second voltage to the gate electrodes during a period after first sense and before second sense.

BRIEF DESCRIPTION OF THE SEVERAL VIEWS OF THE DRAWING

FIG. 1 is a block diagram showing a structure example of a semiconductor memory device (NAND flash memory) according to a first embodiment of the present invention;

FIG. 5 is a circuit diagram of the sense amplifier, illustrating a precharge operation at a time of a '1' data read operation;

FIG. 6 is a circuit diagram of the sense amplifier, illustrating a discharge operation at the time of the '1' data read operation;

FIG. 12 is a circuit diagram showing a structure example of a NAND cell in the NAND flash memory;

FIG. 15 is a view showing, by comparison, recovery times in NAND flash memories;

FIG. 16 is a view showing a current distribution in an ON state or an OFF state of a memory cell transistor of a semiconductor memory device (NAND flash memory) according to a second embodiment of the present invention;

FIG. 17 is a view showing, by comparison, recovery times in NAND flash memories;

DETAILED DESCRIPTION OF THE INVENTION

Figure 2:
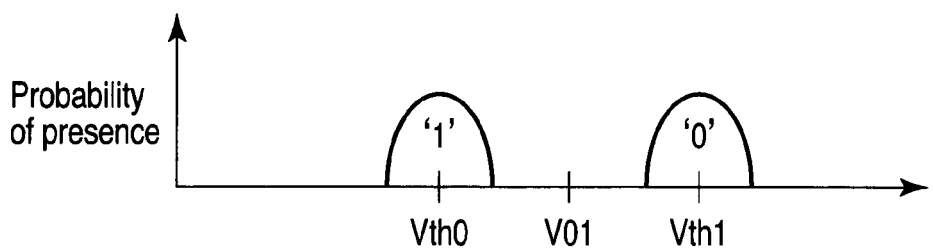
FIG. 2 is a view showing a threshold value distribution of a memory cell transistor in the NAND flash memory.

Embodiments of the present invention will be described with reference to the accompanying drawings. It should be noted that the drawings are schematic ones and so are not to scale. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

A semiconductor memory device according to a first embodiment of the present invention will now be described with reference to FIG. 1. FIG. 1 is a block diagram of a NAND flash memory according to the present embodiment.

<Structure of NAND Flash Memory>

As shown in FIG. 1, the NAND flash memory includes a memory cell array 1, a control unit 2, a row decoder 3, a sense amplifier (S/A) 4, and a plurality of n-channel metal oxide semiconductor (MOS) transistors 5.

<Structure of Memory Cell Array 1>

To begin with, a structure example of the memory cell array 1 is described.

The memory cell array 1 includes a plurality of nonvolatile memory cell transistors MT which can store data. The memory cell transistor MT is, for example, an n-channel MOS transistor having a multi-layer gate which includes a charge accumulation layer and a control gate electrode. The control gate electrode of the memory cell transistor MT functions as a word line WL, a drain region of the memory cell transistor MT is indirectly connected to a bit line BL, and a source region of the memory cell transistor MT is indirectly connected to a source line SL.

The details of the structure of the memory cell array 1 are described below with reference to FIG. 1. As shown in FIG. 1, the memory cell array 1 includes a plurality of NAND cells 7, in each of which a predetermined number of nonvolatile memory cell transistors MT are connected in series. Each of the NAND cells 7 includes, for example, 16 memory cell transistors MT, and select transistors ST1 and ST2. The memory cell transistor MT has a so-called metal oxide nitride oxide semiconductor (MONOS) structure. The MONOS structure includes a charge accumulation layer (e.g. an insulation film) which is formed on a semiconductor substrate via a gate insulation film, an insulation film (hereinafter referred to as "block layer") which is formed on the charge accumulation layer and has a higher dielectric constant than the charge accumulation layer, and a control gate electrode which is formed on the block layer. The number of memory cell transistors MT is not limited to 16, and may be, for instance, 8, 32, 64, 128, or 256. The neighboring memory cell transistors MT share their source regions and drain regions. The memory cell transistors MT are disposed between the select transistors ST1 and ST2 such that their current paths are connected in series. The drain region on one end side of the 16 series-connected memory cell transistors MT is connected to the source region of the select transistor ST1, and the source region on the other end side of the 16 series-connected memory cell transistors MT is connected to the drain region of the select transistor ST2.

The control gate electrodes of the memory cell transistors MT in the same row are commonly connected to an associated one of the word lines WL0 to WL15. The gate electrodes of the select transistors ST1, ST2 of the NAND cells 7 in the same row are commonly connected to the select gate line SGD1, SGS1. For the purpose of simple description, in cases where the word lines WL0 to WL15 are not individually mentioned, the word lines WL0 to WL15 may be simply referred to as "word lines WL". In the memory cell array 1, the drain regions of the select transistors ST1 in the same column are commonly connected to an associated one of the bit lines BL0 to BLn (n: a natural number). Similarly, in cases where the bit lines BL0 to BLn are not individually mentioned, the bit lines BL0 to BLn may generally be referred to as "bit lines BL". The source regions of the select transistors ST2 are commonly connected to the source lines SL. Both the select transistors ST1 and ST2 are not always necessary, and only one of them may be provided if the NAND cell 7 can be selected.

FIG. 1 shows only the NAND cells 7 for one row. However, NAND cells 7 for a plurality of rows may be provided in the memory cell array 1. In this case, the NAND cells 7 in the same column are commonly connected to the same bit line BL. Data is written batchwise in a plurality of memory cell transistors MT which are connected to the same word line WL, and this unit of batch data write is referred to as "page". In addition, data erase is executed batchwise in a plurality of NAND cells 7 in the same row, and this unit of batch data erase is referred to as "memory block".

<Re: the Threshold Value Distribution of the Memory Cell Transistor MT>

Next, referring to FIG. 2, the threshold value distribution of the memory cell transistor MT is described. In FIG. 2, the abscissa indicates the threshold value distribution, and the ordinate indicates the probability of presence of the memory cell transistor MT.

As shown in FIG. 2, each memory cell transistor MT can store, e.g. binary data (2-levels). Specifically, the memory cell transistor MT can store two kinds of data, namely '1' data and '0' data, in the order from the lower threshold voltage Vth.

The threshold voltage Vth0 of '1' data in the memory cell transistor MT is Vth0<V01. The threshold voltage Vth1 of '0' data is V01<Vth1. The memory cell transistor MT is thus configured to be able to store 1-bit data of '0' data or '1' data in accordance with the threshold values. The threshold voltages Vth0 and Vth1 are varied by injecting electric charge in the charge accumulation layer. In addition, the memory cell transistor MT may be configured to store data of four or more values.

<Re: the Current Distribution of the Memory Cell Transistor MT>

Figure 3:
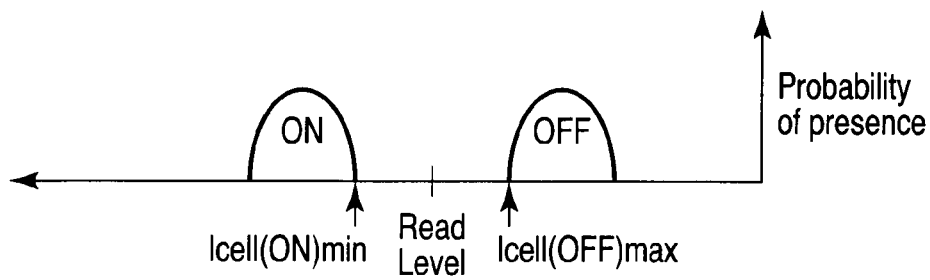
FIG. 3 is a view showing a current distribution in an ON state or OFF state in the memory cell transistor.

Next, referring to FIG. 3, the distribution of electric current flowing in the memory cell transistor MT is described. In FIG. 3, the abscissa indicates the current distribution, and the ordinate indicates the probability of presence of the memory cell transistor MT.

As shown in FIG. 3, each memory cell transistor MT takes one of the ON state and OFF state in accordance with a voltage which is applied from the row decoder 3. A current Icell(ON) flows in the memory cell transistor MT (also referred to as "ON cell") which is in the ON state, and a current Icell(OFF) flows in the memory cell transistor MT (also referred to as "OFF cell") which is in the OFF state. In this manner, the current value of the electric current flowing in the memory cell transistor MT varies in accordance with the ON or OFF state, and the current values have the following relationship: Icell(ON)>Icell(OFF).

Each of the current Icell(ON) and current Icell(OFF) has a distribution with a fixed width. In other words, there is a variance in the current Icell(ON) and current Icell(OFF). This variance occurs due to a variance in characteristics of the memory cell transistor MT itself, or due to a variance in line width of the bit line BL.

A minimum value Icell(ON)min of the current Icell(ON) flowing in the memory cell transistor MT, which is in the ON state, has the relationship: Icell(ON)min>Read Level. In addition, a maximum value Icell(OFF)max of the current Icell(OFF) flowing in the memory cell transistor MT, which is in the OFF state, has the relationship: Icell(OFF)max<Read Level. The "Read Level" is a reference current value, on the basis of which the sense amplifier 4 (to be described later) determines whether data is '0' or '1'. The ratio of a current Icell(ON)max to a current Icell(OFF)min is an ON/OFF ratio. Specifically, as the absolute value of the current Icell(OFF) min is greater, the ON/OFF ratio becomes smaller. On the other hand, as the absolute value of the current Icell(ON) max is greater, the ON/OFF ratio becomes larger. In the memory cell transistor MT, as the ON/OFF ratio is larger, the possibility of erroneous read at the time of a read operation becomes lower.

<Re: the Structure of the Control Unit 2>

Next, the control unit 2 is described with reference to FIG. 1. The control unit 2 controls the operation of the entirety of the NAND flash memory. Specifically, on the basis of a control signal which is delivered from a host (not shown), the control unit 2 executes operation sequences in a data write operation, a data read operation and a data erase operation. The control signal in this case is, for instance, a command and a row address. The control unit 2 outputs, for example, a row address to the row decoder 3. The control unit 2 includes a voltage generating circuit (not shown). The voltage generating circuit generates voltages which are necessary for the data write operation, data read operation and data erase operation, and supplies the voltages to, for example, the row decoder 3 in the NAND flash memory. Furthermore, the control unit 2 includes a bit line clamp transistor (BLC) driver. The BLC driver 6 applies voltages, which correspond to BL voltages that are to be controlled, to the gate electrodes of the n-channel MOS transistors 5.

<Re: the Structure of the Row Decoder 3>

The row decoder 3 selects a signal in the row direction of the memory cell array 1, on the basis of the row address which is delivered from the control unit 2, at the time of the data write operation, data read operation and data erase operation. Specifically, on the basis of the row address that is delivered from the control unit 2, the row decoder 3 applies necessary voltages for the respective operations to the select gate lines SGD1 and SGD2 and the word lines WL0 to WL15.

As shown in FIG. 1, the row decoder 3 includes select gate line drivers 11 and 12 which are provided in association with the select gate lines SGD1 and SGS1, and word line drivers 13 which are provided in association with the respective word lines WL.

The select gate line driver 11 transfers necessary voltages to the gate electrodes of the select transistors ST1 via the select gate line SGD1, in accordance with a decoded result of the row address (page address). In other words, the select gate line driver 11 transfers necessary voltages to the gate electrodes of the select transistors ST1 via the select gate line SGD1 at the time of the write operation, read operation and erase operation and at the time of data verify for the memory cell transistors MT.

The select gate line driver 12 transfers necessary voltages to the gate electrodes of the select transistors ST2 via the select gate line SGS1 at the time of the write operation, read operation and erase operation and at the time of data verify for the memory cell transistors MT. In addition, at the time of the erase operation, a voltage of 0 V is transferred to the gate electrodes of the select gate transistors ST2 via the select gate line SGS1.

Next, the word line drivers 13 are described. The word line drivers 13 transfer necessary voltages to the control gate electrodes of the memory cell transistors MT via the word lines WL in accordance with a decoded result of the page address.

<The Operation of the Word Line Driver 13 at the Time of the Read Operation>

The operation of the word line driver 13 at the time of the read operation is described below.

In the read operation, the word line driver 13 corresponding to a selected word line WL transfers a voltage VCGR to the selected word line WL. The word line drivers 13 corresponding to non-selected word lines WL transfer a voltage VREAD to the non-selected word lines WL. The voltage VREAD is a voltage for setting the memory cell transistor MT in the ON state, regardless of the data of the memory cell transistor MT. The voltage VCGR is varied according to data which is to be read. For example, in the case where the selected word line WL is the word line WL0, the word line driver 13 corresponding to the selected word line WL0 transfers the voltage VCGR to the selected word line WL0. The word line drivers 13 corresponding to the non-selected word lines WL1 to WL15 transfer the voltage VREAD to the non-selected word lines WL1 to WL15. The voltage VCGR corresponds to the voltage V01 which has been described with reference to FIG. 2.

<Re: the Structure of the Sense Amplifier 4>

The sense amplifier 4 senses and amplifies the data which is read out to the bit line BL from the memory cell transistor MT at the time of the data read operation. In addition, at the time of the data write operation, the sense amplifier 4 transfers write data to the associated bit line BL.

Figure 4:
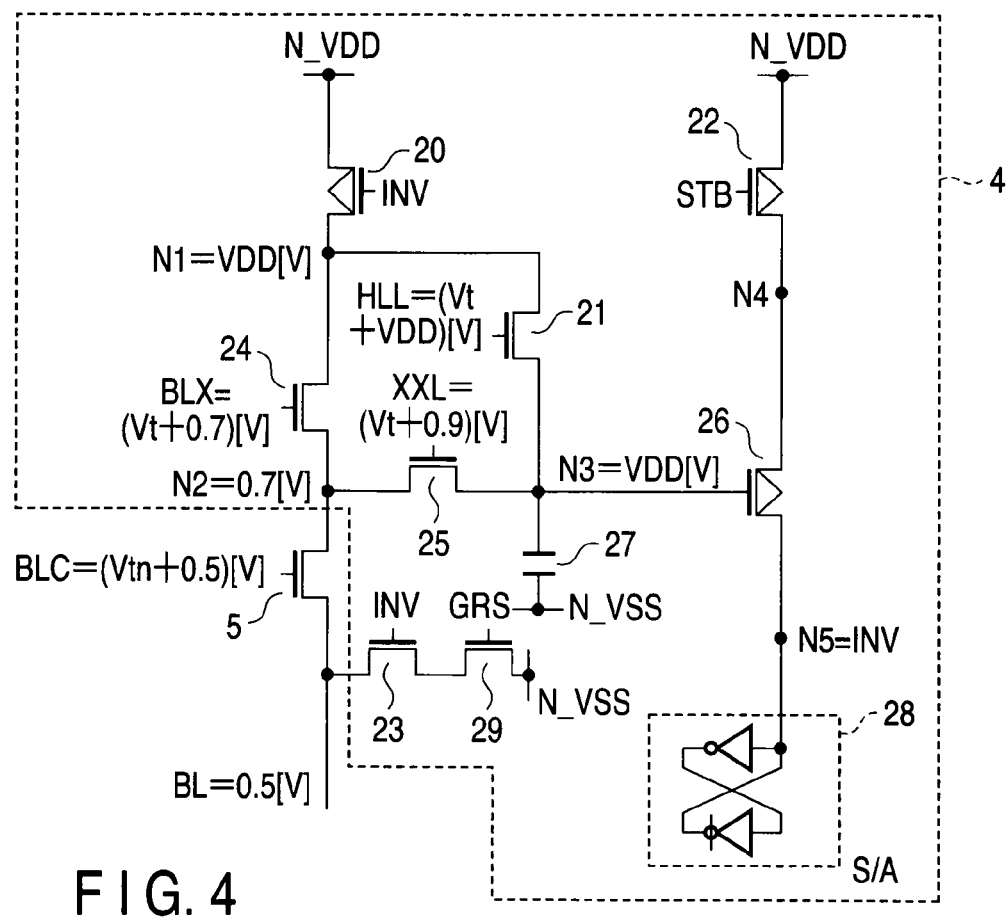
FIG. 4 is a circuit diagram showing a structure example of a sense amplifier in the NAND flash memory.

FIG. 4 shows a circuit structure example of the sense amplifier 4. As shown in FIG. 4, the sense amplifier 4 includes n-channel MOS transistors 21, 23, 24, 25 and 29, p-channel MOS transistors 20, 22 and 26, a capacitor element 27 and a latch circuit 28.

One end of the current path of the MOS transistor 20 is connected to a node N_VDD, the other end of this current path is connected to a node N1, and the gate electrode of the MOS transistor 20 is connected to a node INV. One end of the current path of the MOS transistor 24 is connected to the node N1, the other end of this current path is connected to a node N2, and the gate electrode of the MOS transistor 24 is supplied with a signal BLX. The node N2 is connected to the bit line BL via the current path of the MOS transistor 5. One end of the current path of the MOS transistor 21 is connected to the node N1, the other end of this current path is connected to a node N3, and the gate electrode of the most transistor 21 is supplied with a signal HLL. One end of the current path of the MOS transistor 25 is connected to the node N2, the other end of this current path is connected to the node N3, and the gate electrode of the MOS transistor 25 is supplied with a signal XXL. The node N3 is connected to the node N_VDD via the MOS transistors 20 and 21.

One electrode of the capacitor element 27 is connected to the node N3, and the other electrode thereof is connected to a node N_VSS. One end of the current path of the MOS transistor 22 is connected to a node N_VDD, the other end of this current path is connected to a node N4, and the gate electrode of the MOS transistor 22 is supplied with a signal STB. One end of the current path of the MOS transistor 26 is connected to the node N4, the other end of this current path is connected to the latch circuit 28 via a node N5, and the gate electrode of the MOS transistor 26 is connected to the node N3. One end of the current path of the MOS transistor 23 is connected to the bit line BL, and the gate electrode of the MOS transistor 23 is connected to a node INV. One end of the current path of the MOS transistor 29 is connected to the other end of the current path of the MOS transistor 23, the other end of this current path is connected to a node N_VSS, and the gate electrode of the MOS transistor 23 is supplied with a signal GRS. The MOS transistor 23 is ON/OFF switched in accordance with data that is stored in the latch circuit 28. Specifically, in the case where the data that is stored in the latch circuit 28 is '1' data, the MOS transistor 23 is set in the ON state, and if a 'HIGH(H)' level signal is supplied as the signal GRS to the gate electrode of the MOS transistor 29, the bit line BL is connected to the node N_VSS. In the case where the data that is stored in the latch circuit 28 is '0' data, the MOS transistor 23 is kept in the OFF state, and even if the 'H' level signal is supplied as the signal GRS to the gate electrode of the MOS transistor 29 and the MOS transistor 29 is set in the ON state, the bit line BL is not connected to the node N_VSS.

The node N_VDD functions as a power supply voltage node of the sense amplifier 4, and supplies, for example, a voltage VDD. The voltage VDD is an internal power (e.g. 2.2 V) of the NAND flash memory. The node N_VSS functions as a ground node of the sense amplifier 4, and supplies, for example, a voltage VSS. In short, the voltage VSS is a ground potential (0 V).

<Re: the MOS Transistor 5>

Each of the n-channel MOS transistors 5 connects the bit line BL and the sense amplifier 4. Specifically, one end of the current path of each MOS transistor 5 is connected to the associated bit line BL, and the other end of this current path is connected to the associated sensor amplifier 4. The gate electrode of each MOS transistor 5 is supplied with the signal BLC that is generated by the BLC driver 6. If the MOS transistor 5 is set in the ON state, the bit line BL and the sense amplifier 4 are electrically connected.

<Re: the Read Operation of the NAND Flash Memory>

Next, the read operation of the NAND flash memory having the above-described structure is described.

<Re: the Operation of the Sense Amplifier 4>

To begin with, referring to FIG. 5 to FIG. 8, a description is given of the operation of the sense amplifier 4 at the time of the read operation. FIG. 5 to FIG. 8 are circuit diagrams of the sense amplifier 4.

At the time of the data read operation, the sense amplifier 4 determines that the read data is '1', by sensing the current Icell(ON) which flows when the memory cell transistor MT is in the ON state, that is, when the bit line BL and the source line SL are set in the conductive state. On the other hand, when the memory cell transistor MT is in the OFF state, that is, when the bit line BL and the source line SL are rendered substantially non-conductive, the sense amplifier 4 senses the current Icell(OFF) and determines that the read data is '0'.

During the read operation, the signal BLX is set at a voltage (Vt+0.7 V), and the signal XXL is set at a voltage (Vt+0.9 V).

The node INV is set at one of 0 V and a voltage VDD. The signal node INV takes one of the 'L' level and 'H' level in accordance with the state of the latch circuit 28 which is connected to the node N5. The signal BLC is controlled by the BLC driver 6, and is set at one of a voltage (Vtn+0.5 V) and a voltage (Vt+0.6 V). The signal HLL is set at one of a voltage (Vt+VDD) or more, and 0 V. The signal GRS is, for example, one of 0 V and a voltage VDD. A voltage Vt is a threshold voltage of the MOS transistors 21, 24, and 25, and Vtn is a threshold voltage of the MOS transistor 5. The signal STB is set at one of 0 V and a voltage VDD. The above-described signals BLX, XXL and HLL are delivered from the control unit 2.

At first, a description is given of CASE 1 in which '1' data is read out. The sense amplifier 4 according to the present embodiment senses the variation of the current flowing in each bit line BL connected to the sense amplifier 4. At this time, the sense amplifier 4 adopts a method in which data is read batchwise from all bit lines BL.

<<CASE I>>

To start with, as shown in FIG. 5, precharge is executed in the bit line BL. In the description below, it is assumed that the precharge level VPRE is 0.5 V.

As shown in FIG. 5, since the voltage at the node N5 is 0 V, an 'L' level is applied as a node INV to the gate electrode of the MOS transistor 20. In addition, a voltage (Vt+0.7 V) is applied as a signal BLX to the gate electrode of the MOS transistor 24. Thereby, the MOS transistors 20 and 24 are set in the ON state. Then, a current flows to the bit line BL via the current path of the MOS transistor 20, node N1, MOS transistor 24, node N2 and MOS transistor 5. At this time, since a voltage (Vtn+0.5 V) is applied as a signal BLC, the potential of the bit line BL is set at about 0.5 V. Specifically, while a current is let to flow from the bit line BL to the source line SL, the potential of the bit line BL is fixed at, e.g. 0.5 V. In addition, a voltage (Vt+VDD) is applied as a signal HLL to the gate electrode of the MOS transistor 21, and the MOS transistor 21 is set in the ON state. Thereby, the capacitor element 27 is charged, and the potential at the node N3 is set at about VDD. The MOS transistors 22 and 23 are in the OFF state.

Next, as shown in FIG. 6, the node N3 is discharged. Specifically, the MOS transistor 21 is set in the OFF state. Then, the node N3 is discharged by a current flowing from the node N3 to the bit line BL, and the potential at the node N3 lowers to about 0.7 V. At this time, the current flowing in the node N3 is assumed to be a current Isen.

Figure 7:
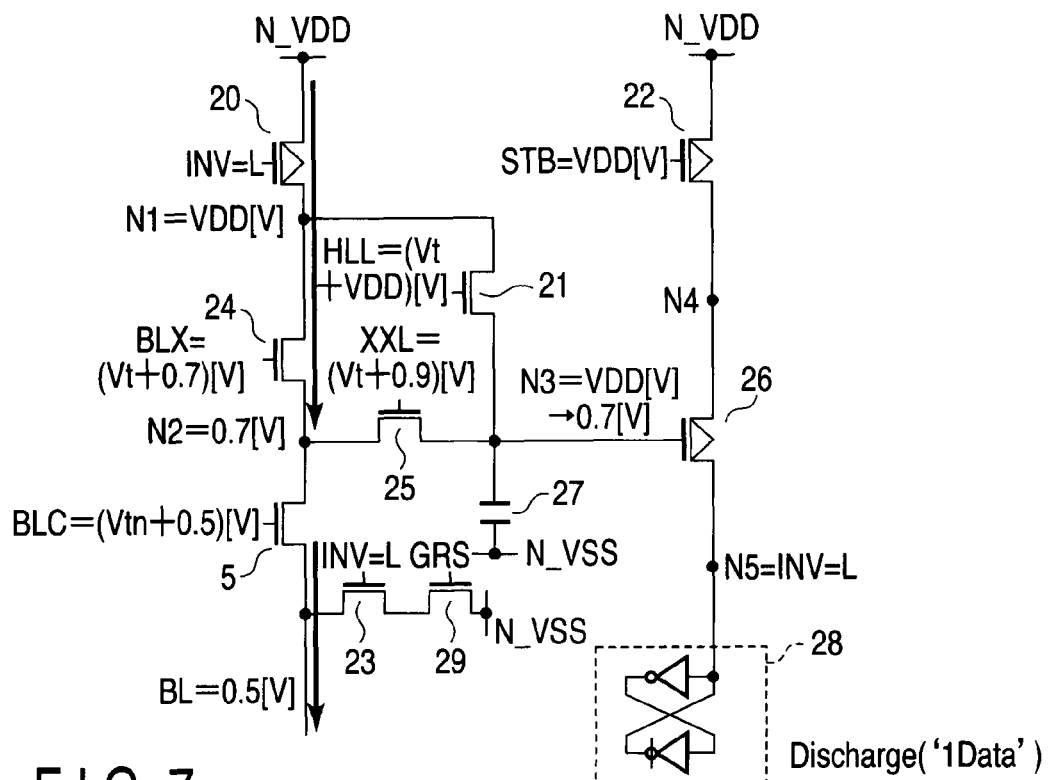
FIG. 7 is a circuit diagram of the sense amplifier, illustrating a discharge operation at the time of the '1' data read operation.

Subsequently, as shown in FIG. 7, if the potential at the node N2 tries to fall to 0.7 V or less, the MOS transistor 24 is turned on. Thereby, the supply of current from the node N_VDD begins. As a result, the potential at the node N2 is kept at 0.7 V.

Figure 8:
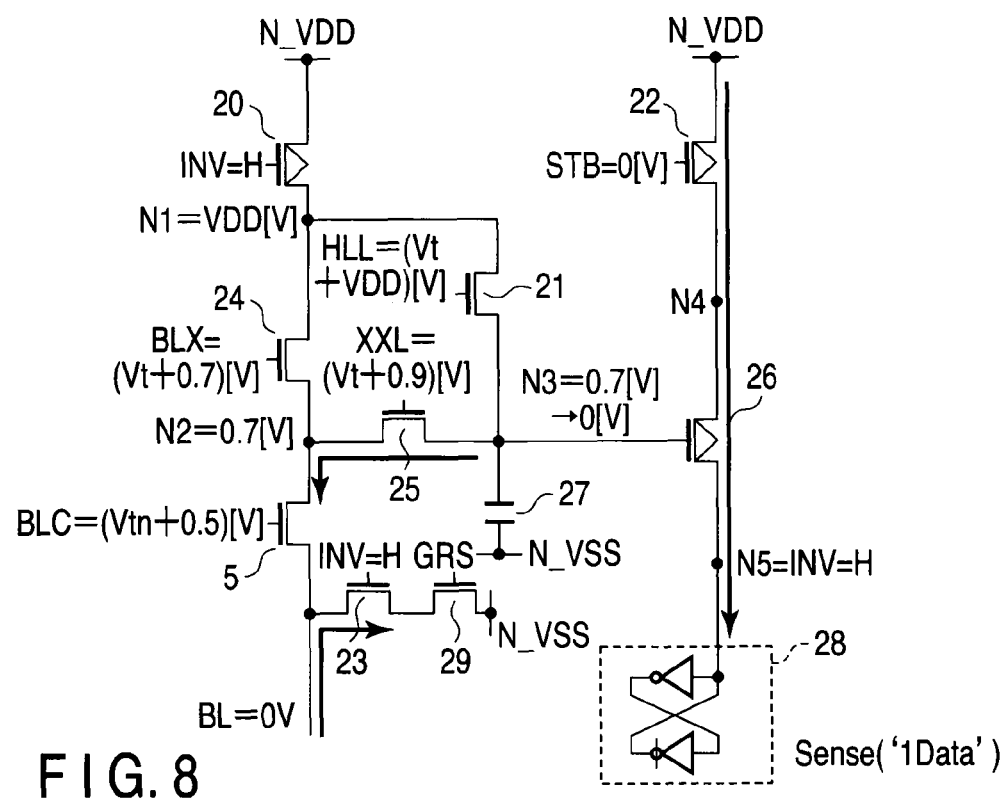
FIG. 8 is a circuit diagram of the sense amplifier, illustrating a sense operation at a time of the '1' data read operation.

Next, as shown in FIG. 8, data sense is executed. As shown in FIG. 8, 0 V is applied as a signal STB to the gate electrode of the MOS transistor 22, and the MOS transistor 22 is set in the ON state. In addition, since the potential of the node N3 is 0.7 V, the MOS transistor 26 is set in the ON state. Thus, with the voltage VDD being kept by the latch circuit 28, the 'H' level is applied as the node INV to the gate electrodes of the MOS transistors 20 and 23. Thereby, the MOS transistor 20 is set in the OFF state and the MOS transistor 23 is set in the ON state. With the MOS transistor 29 being turned on, the potential at the node N3 becomes 0 V. Hence, the latch circuit 28 keeps the voltage VDD. In other words, the latch circuit 28 keeps '1' data. In addition, a current flows from the bit line BL to the node N_VSS via the MOS transistors 23 and 29, and the potential of the bit line BL becomes 0 V.

As has been described above, the data read operation is executed by sensing the current flowing through the node N3 by means of the sense amplifier 4. In other words, by sensing the current flowing in the bit line BL, the data read operation is executed.

Specifically, if the current at the node N3, which is the reference for determining '1' data or '0' data, is referred to as "Itrip", the MOS transistor 26 is set in the ON state when Itrip≦Isen, and '1' data is stored in the latch circuit 28. In the meantime, the current Itrip can be varied by the threshold of the MOS transistor 26. The "Read Level", which has been described with reference to FIG. 3, corresponds to the current Itrip.

In the present embodiment, in the operation of reading each data, the process up to the precharge, discharge and sense, which are shown in FIG. 5 to FIG. 8, is executed at least twice. In the description below, the period for executing the process from the first precharge to sense is referred to as T1, and the period for executing the process from the second precharge to sense is referred to as T2. When the second sense is to be executed, in the first sense operation, at first, data read is executed from the memory cell transistor MT in which cell current easily flows, and then data read is executed from the memory cell transistor MT in which cell current does not easily flow. This aims at suppressing the influence of the noise (variation) of the source line SL. While the memory cell transistor MT, which was set in the ON state in the first read operation, is set in the OFF state, the second read operation is executed.

In the case where the second sense is executed by the sense amplifier 4, if '1' data is determined in the first sense operation, the MOS transistor 20 is set in the OFF state. Thus, the potential of the bit line BL is fixed at the voltage VSS.

<<CASE II>>

Next, the case of reading '0' data is described as CASE II.

In the case of '0' data, compared to the case of reading '1' data, current hardly flows in the bit line BL, and the potential of the bit line BL is kept at 0.5 V. Specifically, while very small current Icell(OFF) is flowing from the bit line BL to the source line SL, the potential of the bit line BL is fixed at 0.5 V. In addition, the potential of the node N3 is kept at the voltage VDD. Accordingly, the MOS transistor 26 is set in the OFF state, and the latch circuit 28 keeps 0 V. Thereby, the MOS transistor 20 is set in the ON state, the MOS transistor 23 is set in the OFF state, the potential of the node 3 is kept at about 2.2 V, and the latch circuit 28 keeps 0 V. Specifically, since the MOS transistor 26 is in the OFF state, the current Isen flowing through the node N3 at the time of the operation of reading '0' data is lower than the current Itrip flowing in the MOS transistor 26. In other words, the current Icell(OFF) is smaller than the current Itrip.

Although repeatedly stated, the time from the first precharge to the completion of sense is referred to as T1.

<Re: the Operation of the BLC Driver 6>

Figure 9:
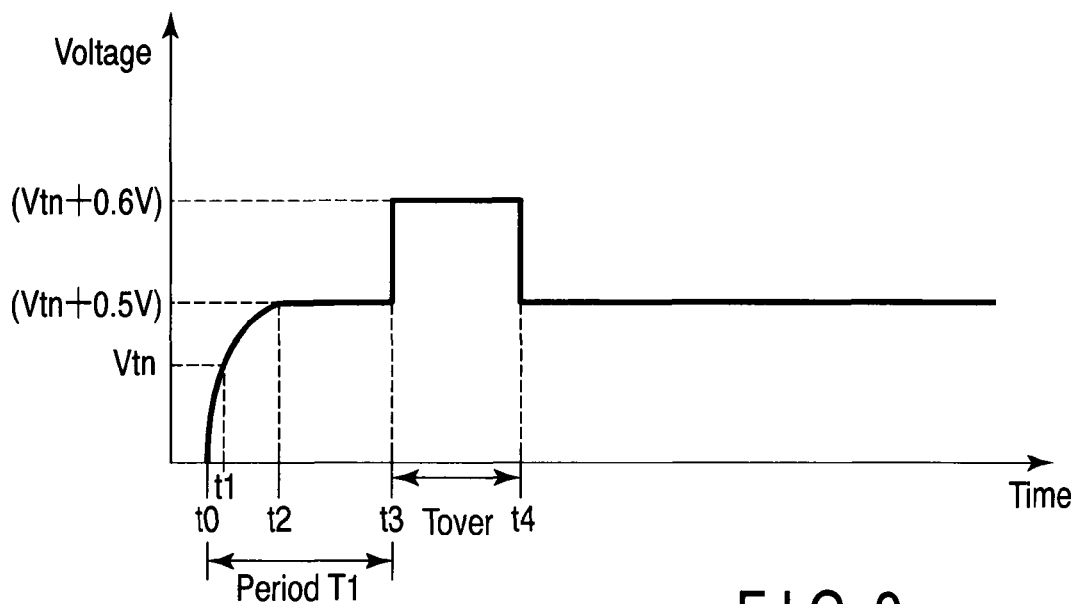
FIG. 9 is a time chart illustrating the operation of a bit line driver in the NAND flash memory.
Figure 10:
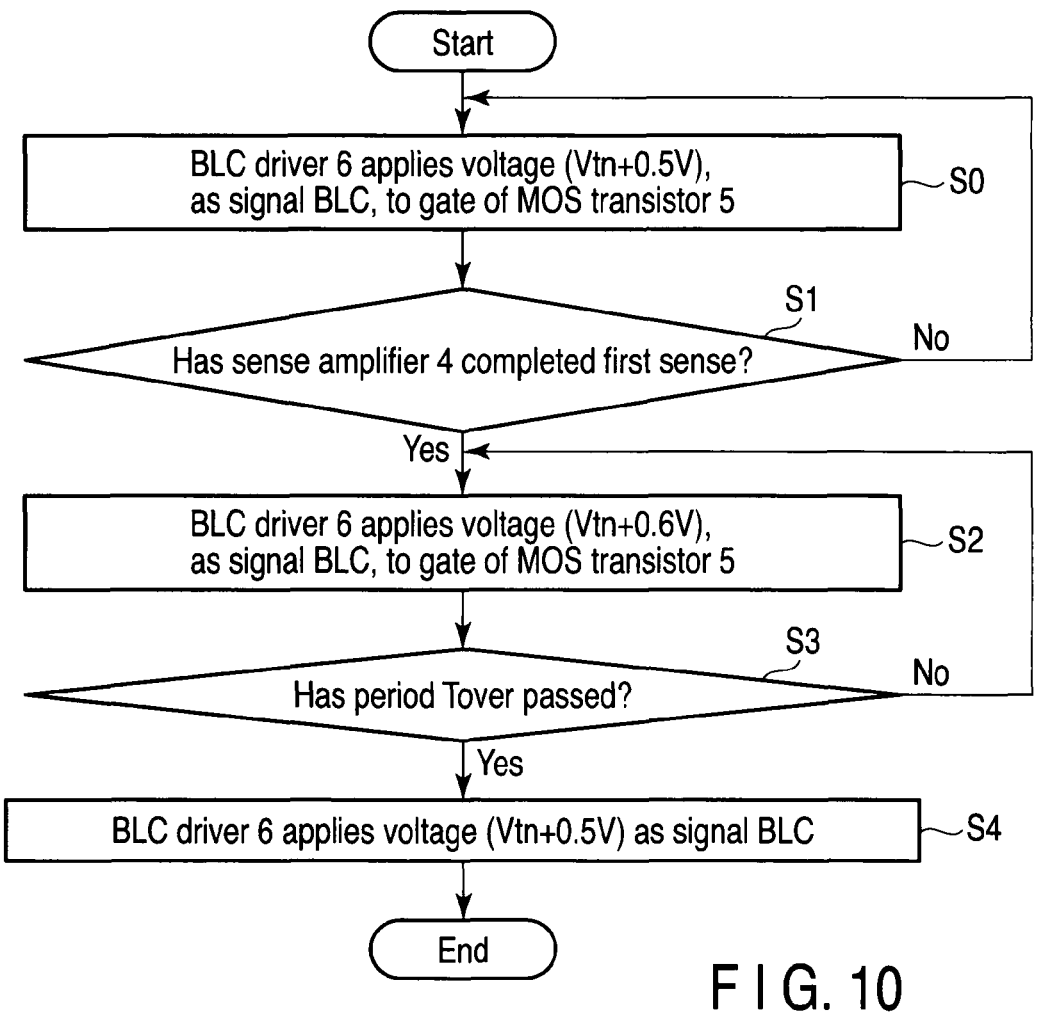
FIG. 10 is a flow chart illustrating the operation of the bit line driver.

Next, referring to FIG. 9 and FIG. 10, a description is given of the operation of the BLC driver 6 at the time of the read operation. FIG. 10 is a flow chart illustrating the operation of the BLC driver 6. FIG. 9 is a time chart showing the voltage which is applied to the gate electrode of the MOS transistor 5. In FIG. 9, the abscissa indicates time, and the ordinate indicates voltage.

To start with, when data read is executed, the BLC driver 6 applies a voltage (Vtn+0.5 V) as a signal BLC to the gate electrodes of the MOS transistors 5 corresponding to all the bit lines BL, thereby to start precharge of the bit line BL (time point t0 in FIG. 9). Then, until time point t3, the BLC driver 6 continues to apply the voltage (Vtn+0.5 V) as signal BLC (step S0 in FIG. 10).

Next, the BLC driver 6 confirms whether the sense amplifier 4 has completed the first sense (step S1). If the sense amplifier 4 has not completed the first sense (NO in step S1), the BLC driver 6 continues to apply the voltage (Vtn+0.5 V) to the gate electrode of the MOS transistor 5.

If the sense amplifier 4 has completed the first sense (YES in step S1), the BLC driver 6 applies a voltage (Vtn+0.6 V), which is higher than the voltage in the period T1, to the gate electrode of the MOS transistor 5 as the signal BLC (step S2; time point t3 in FIG. 9).

Then, the BLC driver 6 confirms whether a period Tover has passed, that is, whether a time point t4 has passed (step S3). If time point t4 has not passed (NO in step S3), the BLC driver 6 continues to apply the voltage (Vtn+0.6 V) to the gate electrode of the MOS transistor 5.

If time point t4 has passed (YES in step S3), the BLC driver 6 restores the potential of the signal BLC from the voltage (Vtn+0.6 V) to the voltage (Vtn+0.5 V) (step S4; time point t4 in FIG. 9).

The period Tover is a period during which the BLC driver 6 applies the voltage (Vtn+0.6 V) to the gate electrode of the MOS transistor 5, in order to amplify the current flowing in the MOS transistor 5. Specifically, with the application of the voltage (Vtn+0.6 V) by the BLC driver 6, a greater current flows in the bit line BL during the period Tover.

<Re: the General Flow of the Read Operation>

The general flow of the read operation of the NAND flash memory will now be described, taking into account the above-described behavior of the current flowing in the bit line BL.

<<Read Operation (1)>>

Figure 11:
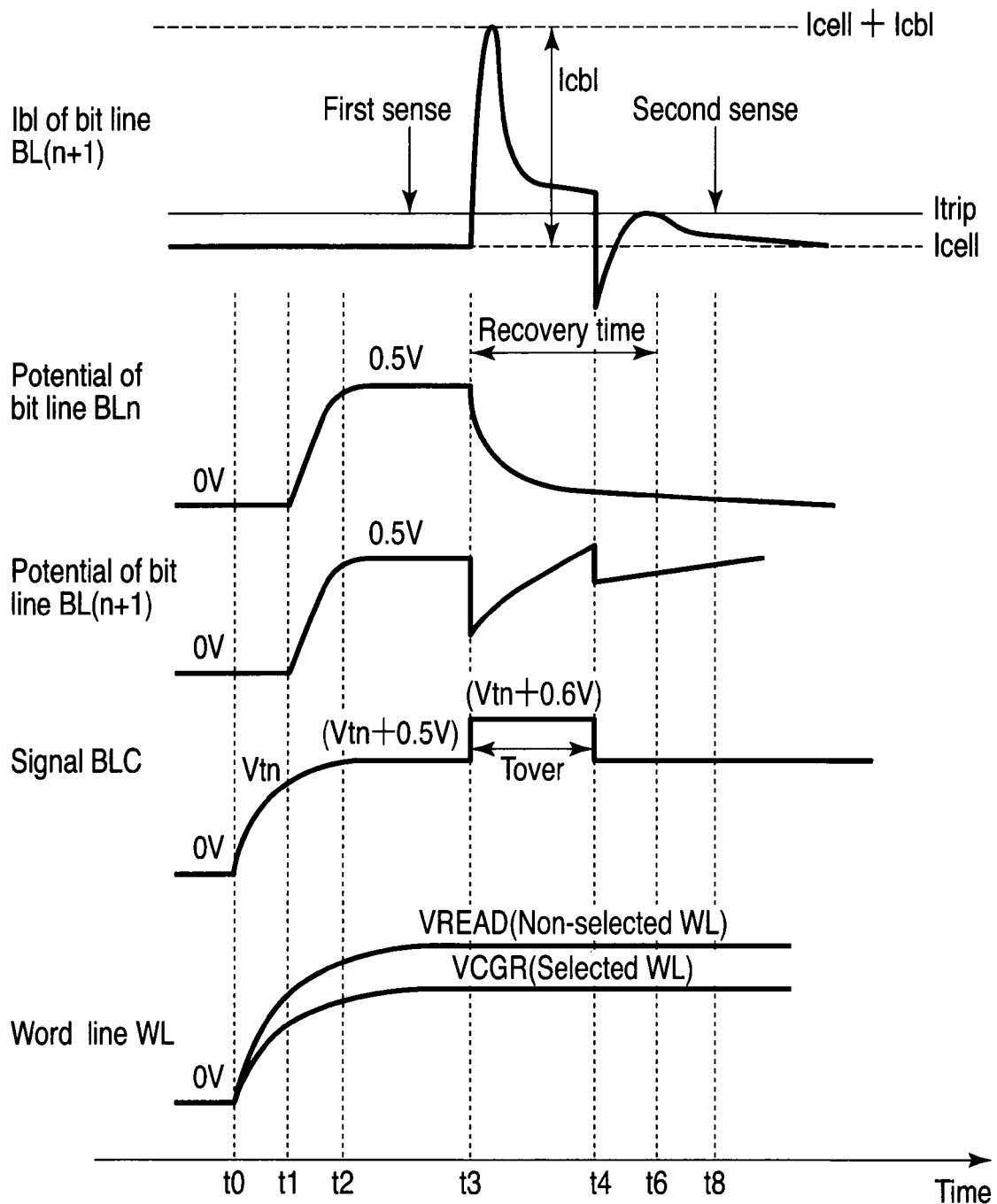
FIG. 11 is a time chart showing variations of voltages at the time of the read operation in the NAND flash memory.

To begin with, referring to FIG. 11, a description is given of the case in which the memory cell transistor MT which is connected to the bit line BLn stores '1' data, and the memory cell transistor MT which is connected to the bit line BL(n+1) stores '0' data. FIG. 11 is a time chart showing variations of the potential and current Ibl of the bit line BL(n+1), the potential of the bit line BLn, the potential of the signal BLC and the potential of the word line WL at the time of the read operation.

<Step 1: Start>

As shown in FIG. 11, at time point t0, the read operation is started. At time point t0, the row decoder 3 applies a voltage VCGR to the selected word line WL, and a voltage VREAD to the non-selected word line WL. As a result, the memory cell transistor MT, which is connected to the non-selected word line WL, is set in the ON state, and the memory cell transistor MT, which is connected to the selected word line WL, is set in the ON state or OFF state in accordance with the stored data.

<Step 2: Precharge>

Next, as regards the sense amplifier 4, at time point t1, when the signal BLC rises to the voltage Vtn, the bit line BL begins to be precharged. As described above, the voltage Vtn is the threshold of the MOS transistor 5. As described above, since the memory cell transistor MT that is connected to the bit line BLn retains '1' data, this transistor MT is in the ON state. Thus, the current Icell(ON) flows between the bit line BLn and source line SL, and, at time point t2, the potential of the bit line BLn is set at, e.g. 0.5 V. The operation of the sense amplifier 4 is as shown in FIG. 5.

On the other hand, since the memory cell transistor MT that is connected to the bit line BL(n+1) retains '0' data, this transistor MT is in the OFF state. Thus, the current Icell(OFF) flows between the bit line BL(n+1) and source line SL, and, at time point t2, the potential of the bit line BL(n+1) is fixed at 0.5 V.

<Step 3: First Sense>

Subsequently, after the passing of time point t2, as has been described with reference to FIG. 8, the sense amplifier 4 executes first sense. Specifically, the discharge, which has been described with reference to FIG. 5 and FIG. 6, is executed by the sense amplifier 4 that is connected to the bit line BLn. In the case of this example, since Isen(Icell)>Itrip, the MOS transistor 26 is set in the ON state, and '1' data is stored in the latch circuit 28.

On the other hand, discharge is not executed in the sense amplifier 4 that is connected to the bit line BL(n+1), and Isen(Icell)<Itrip. Thus, the MOS transistor 26 is set in the OFF state, and '0' data is stored in the latch circuit 28.

<Step 4: Recovery of the Bit Line>

Next, at time point t3, the BLC driver 6 switches the potential of the signal BLC from the voltage (Vtn+0.5 V) to the voltage (Vtn+0.6 V). The BLC driver 6 continues to apply the voltage (Vtn+0.6 V) as the signal BLC until time point t4 at which the period Tover from time point t3 ends. In addition, the MOS transistor 23 of the sense amplifier 4 corresponding to the bit line BLn is set in the ON state. As a result, the potential of the bit line BLn lowers to 0 V. On the other hand, the MOS transistor 23 of the sense amplifier 4 corresponding to the bit line BL(n+1) is in the OFF state. Specifically, the bit line BL(n+1) tries to keep 0.5 V. However, owing to the potential difference between the bit line BL(n+1) and the neighboring bit line BLn, the potential of the bit line BL(n+1) temporarily drops.

Referring now to FIG. 12, a detailed description is given of the relationship between the voltage and current of the bit line BL(n+1) after time point t3. FIG. 12 is a circuit diagram showing the NAND cells 7 which are connected to the bit line BLn and bit line BL(n+1).

As has been described above, since the memory cell transistor MT that is connected to the bit line BL(n+1) retains '0' data, the potential of the bit line BL(n+1) is kept at 0.5 V. However, since the memory cell transistor MT that is connected to the bit line BLn retains '1' data, the potential of the bit line BLn lowers to about 0 V. Then, at time point t3, owing to the potential difference between the bit line BLn and the bit line BL(n+1), a current (hereinafter referred to as "current Icbl") flows to charge an inter-line capacitance 30 which is present between the bit line BLn and the bit line BL(n+1). As a result, the potential of the bit line BL(n+1) temporarily lowers in a period from time point t3 until the inter-line capacitance 30 is charged.

From FIG. 12, the current Ibl flowing in the bit line BL(n+1), in which the voltage temporarily drops, is expressed by $$Ibl = Icell + Icbl \quad (1)$$

From the above equation (1), since the current Icbl occurs, as shown in FIG. 11, the current Ibl, which flows through the bit line BL(n+1), becomes temporarily higher than the current Icell (=Icell(OFF)) which flows through the memory cell transistor MT. Thereby, the potential of the bit line BL(n+1) is charged up to 0.5 V. Thus, in order to exactly execute data sense in the sense amplifier 4, it is necessary to wait until the transitionally flowing current Icbl becomes zero and Ibl becomes Ibl=Icell. The reason for this is that erroneous data read may occur in the sense amplifier 4 if the Ibl=Isen differs from the current Icell. In the description below, this wait time is referred to as "recovery time". The recovery time should desirably be a time period from when the MOS transistor 23 is set in the ON state to when the current Ibl restores to the current Icell, that is, a time period until the potential of the bit line BL(n+1) restores to 0.5 V. However, it is not always necessary that the recovery time be a period until Ibl=Icell, and there is no problem if the recovery time is a time period until Isen=Ibl≦Itrip.

Next, at time point t4, at the same time as the voltage (Vtn+0.6 V) that is applied to the gate electrode is switched to the voltage (Vtn+0.5 V), the current Ibl becomes temporarily lower than the current Icell(OFF), and then again the current Ibl becomes higher than the current Itrip. Then, if the potential of the bit line BL(n+1) reaches 0.5 V, the current Ibl, at time point t6, becomes lower than the current Itrip and reaches the level of the current Icell(OFF). That is, the current Ibl becomes Itrip≦Isen=Ibl=Icell.

As shown in FIG. 11, the recovery time of the bit line BL(n+1) is a period from time point t3 to time point t6 at which Isen≦Itrip. The period Tover may be shorter or longer than the recovery time.

<Step 5: Second Sense>

Next, referring to FIG. 11, the second sense is described. The sense amplifier 4 executes the second sense at time point t8 at which at least the recovery time has passed since time point t3. Specifically, the precharge and discharge illustrated in FIG. 5 to FIG. 8 are executed, and at time point t8, the second sense is executed. The second sense operation is started for only the memory cell transistor MT, which has been determined to store '0' data in the first sense. Specifically, since the supply path to the bit line BL and node SEN are cut off for the memory cell transistor MT which has been determined to store '1' data in the first sense, the second sense is not executed for this transistor MT. The potential of the bit line BL, which is connected to this memory cell transistor MT, is fixed at, e.g. 0 V.

<<Read Operation (2)>>

Next, a description is given of the case in which the memory cell transistor MT which is connected to the bit line BLn stores '0' data, and the memory cell transistor MT which is connected to the bit line BL(n+1) is determined to store '0' data in the first sense, although the memory cell transistor MT connected to the bit line BL(n+1) actually stores '1' data.

A brief explanation is given of the reason why the read data is determined to be '0' data, despite '1' data being stored. In many cases, the current flowing in the memory cell transistor MT varies due to a variance in resistance which results from the largeness/smallness of the line width of the bit line BL. Hence, even if the threshold value is the same, the value of the current Ibl flowing in the bit line BL differs. In other words, the value of the current Icell flowing in the memory cell transistor MT differs. Further, owing to the variance in characteristics of each memory cell transistor MT, such a distribution as shown in FIG. 3 occurs in the current flowing in the memory cell transistor MT, even in the same ON state. Specifically, as shown in FIG. 11, in the first sense, such a phenomenon occurs that a larger electric current tends to flow in a memory cell transistor MT having more excellent characteristics. At the time of the data read operation, as described above, the sense amplifier 4 according to the present embodiment adopts the method in which data read is executed batch-wise from all the bit lines BL. Thus, the current flowing in all bit lines BL at the time of the first sense is larger. Accordingly, the potential of the source line SL tends to become higher than 0 V. As a result, there is a tendency that the source-drain current of the memory cell transistor MT, which is in the ON state, becomes smaller.

Moreover, if the characteristics of a memory cell transistor MT are poorer than those of others, the potential of the bit line BL tends to not easily drop. As a result, as has been described with reference to FIG. 8, the potential at the gate electrode of the MOS transistor 26 does not drop at the time of sense, and the MOS transistor 26 is set in the OFF state. Consequently, the latch circuit 28 continues to store '0' data. Specifically, in some cases, the sense amplifier 4 erroneously determines that the read data is '0' data.

Figure 13:
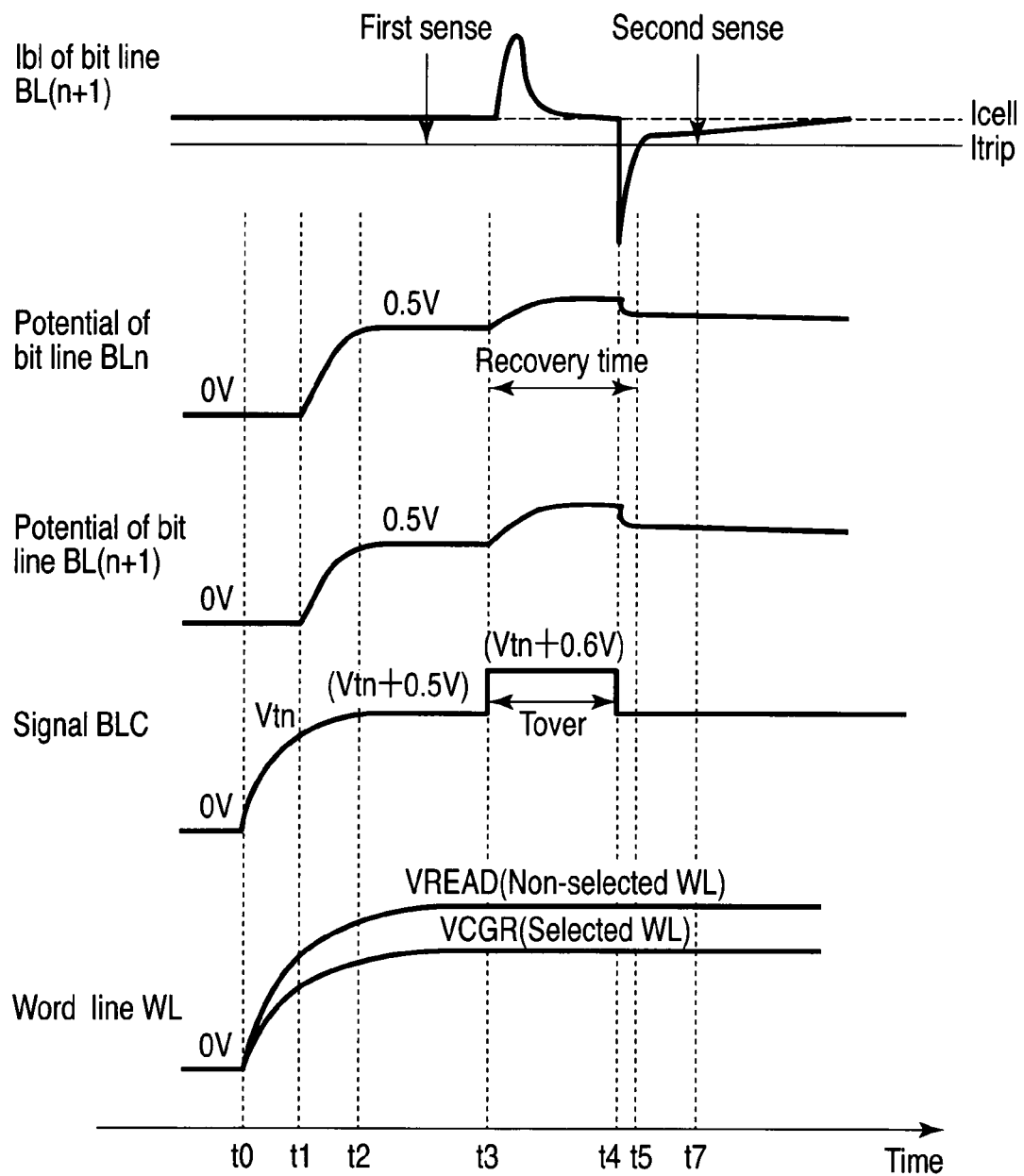
FIG. 13 is a time chart showing variations of voltages at the time of the read operation in the NAND flash memory.

In the description below, with reference to FIG. 13, a description is given of only the operation which differs from the above described read operation (1).

<Step 1: Precharge>

At time point t1, the potential of the signal BLC rises to the voltage (Vth+0.5 V), and the sense amplifier 4 executes precharge for the bit line BL. As has been described above, since the memory cell transistor MT, which is connected to the bit line BLn, stores '0' data, this memory cell transistor MT is in the OFF state. Accordingly, the current Icell(OFF) flows between the bit line BLn and the source line SL, and at time point t2, the potential of the bit line BLn is set at 0.5 V. The operation of the sense amplifier 4 at this time is as shown in FIG. 5.

Similarly, since the memory cell transistor MT, which is connected to the bit line BL(n+1), stores '0' data, this memory cell transistor MT is in the OFF state. Accordingly, the current Icell(OFF) also flows between the bit line BL(n+1) and the source line SL, and at time point t2, the potential of the bit line BL(n+1) is fixed at 0.5 V.

<Step 2: First Sense>

Next, after the passing of time point t2, the first sense is executed. Since the potential of the bit line BL(n+1) is fixed at, e.g. 0.5 V, the sense amplifier 4 that is connected to the bit line BL(n+1) does not execute the discharge, which has been described with reference to FIG. 5 and FIG. 6. Thereby, since Isen(Icell)<Itrip, the MOS transistor 26 is set in the OFF state and '0' data is stored in the latch circuit 28.

Similarly, the sense amplifier 4 that is connected to the bit line BL(n+1) does not execute the discharge, and Isen(Icell) <Itrip. Accordingly, the MOS transistor 26 is set in the OFF state and '0' data is stored in the latch circuit 28.

Consequently, in each of the bit line BLn and bit line BL(n+1), the current Icell(OFF) flows to the source line SL. Accordingly, 0.5 V is kept in each of the bit line BLn and bit line BL(n+1). In short, in FIG. 13, no potential difference occurs between the bit line BLn and the neighboring bit line BL(n+1), and the current Icbl does not flow.

<Step 3: Recovery of the Bit Line>

Next, at time point t3, the BLC driver 6 switches the potential of the signal BLC from the voltage (Vtn+0.5 V) to the voltage (Vtn+0.6 V). The BLC driver 6 continues to apply the voltage (Vtn+0.6 V) as the signal BLC during the period from time point t3 to time point t4 at which the period Tover ends. Thereby, during the period from time point t3 to time point t7, the bit line BL(n+1) is overcharged. As a result, the current Ibl flowing in the bit line BL(n+1) becomes higher than the current Itrip. After the passing of the period Tover from time point t3, that is, at time point t4, the potential of the signal BLC is restored to the voltage (Vtn+0.5 V). Thereby, the current Ibl of the bit line BL(n+1) becomes smaller than the current Itrip. Thereafter, at time point t5, the current Ibl becomes greater than the current Itrip.

<Step 5: Second Sense>

Next, at time point t7, the sense amplifier 4 executes the second sense of the bit line BL, which has been determined to be in the OFF state in the first sense. This operation is the same as in the case of FIG. 11. As regards the timing of the above-described second sense, the relationship between time point t7 in FIG. 13 and time point t8 in FIG. 11 is not limited to t8>t7, and may be t8<t7, or t8=t7.

Advantageous Effect of the Present Embodiment

As has been described above, according to the NAND flash memory of the first embodiment, the following advantageous effect (1) is obtained.

(1) The read Time can be Shortened (Part 1).

The advantageous effect of the NAND flash memory according to the present embodiment is described by taking, as a comparative example, the case in which the signal BLC that is applied to the gate electrode of the MOS transistor 5 is fixed to the voltage (Vtn+0.5 V) in the first sense and the second sense.

Figure 14:
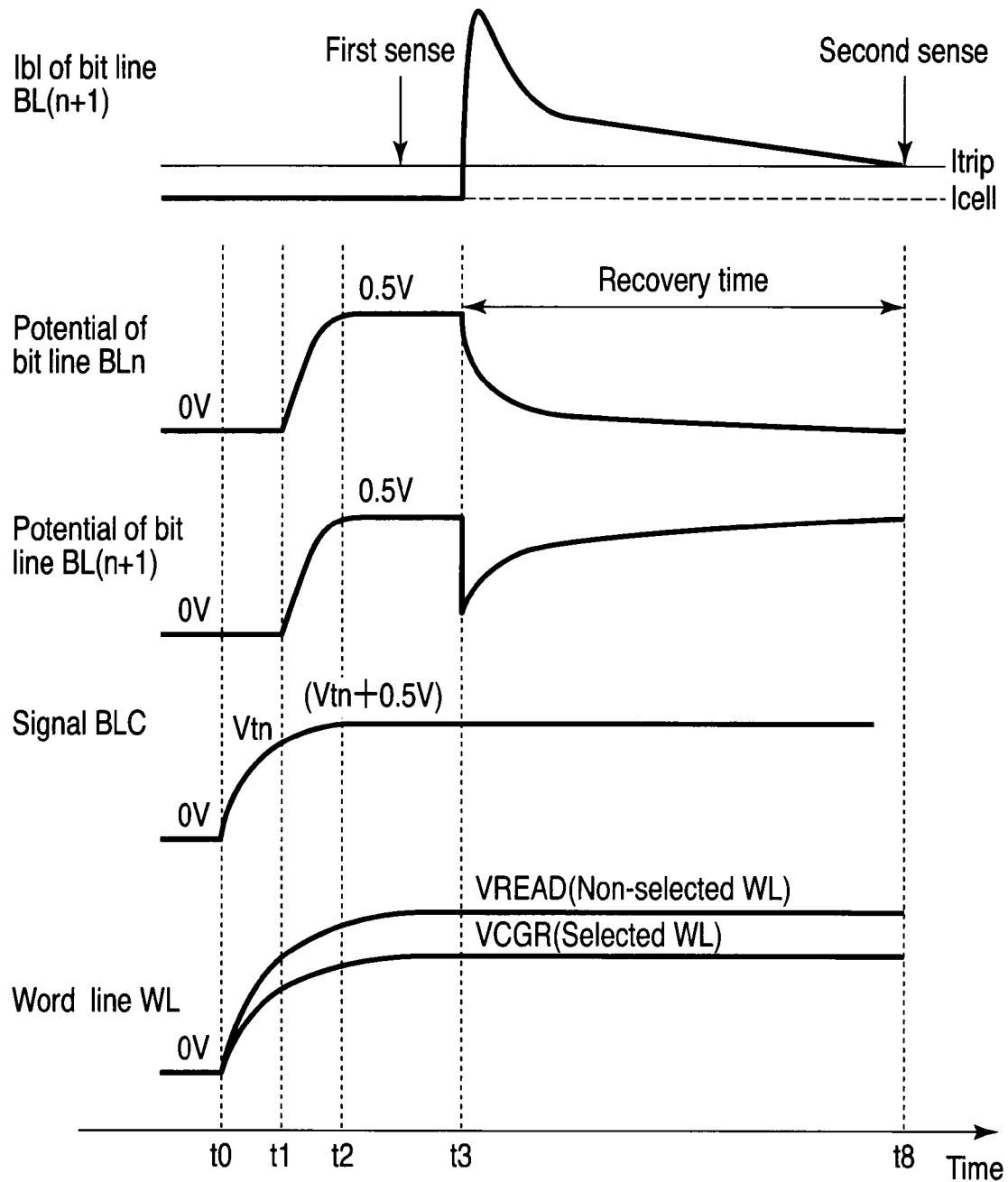
FIG. 14 is a time chart showing, for the purpose of comparison, variations of voltages at a time of a read operation.

FIG. 14 is a time chart showing variations of the potential and current Ibl of the bit line BL(n+1), the potential of the bit line BLn, the potential of the signal BLC and the potential of the word line WL at the time of the read operation in the case where the signal BLC is set at the fixed voltage (Vtn+0.5 V). In the description below, the case is assumed in which the bit line BLn is determined to be in the ON state and a voltage drop occurs to voltage VSS, and the bit line BL(n+1) is determined to be in the OFF state. The variations of potentials at the respective nodes from time point t0 to time point t3 are the same as those in FIG. 13, so a description thereof is omitted here.

As shown in FIG. 14, at time point t3, the BLC driver 6 keeps constant the signal BLC at the voltage (Vtn+0.5 V). Thus, it takes a long time for the potential of the bit line BL(n+1), in which a temporary voltage drop has occurred, to rise to the set voltage (e.g. precharge level), i.e. 0.5 V. The reason for this is that the potential of the gate electrode of the MOS transistor 5 is constant, despite the potential of the bit line BL(n+1) falling from 0.5 V. In other words, the reason is that the current Ibl for charging the bit line BL(n+1) is not adequate, compared to the case of the present embodiment. For example, the current Ibl flowing in the bit line BL(n+1) becomes greater than the current Itrip at time point t3, and thereafter the current Ibl becomes lower than the current Itrip at time point t8. In short, the recovery time increases.

The recovery time in this comparative example occupies about half the time in the above-described batch read method for all bit lines BL. An increase in read time is caused by a further increase in the recovery time due to the increase in resistance by microfabrication of bit lines BL in recent years, or due to the increase in capacitance by the extension of bit lines BL according to additional provision of memories. The read time, in this context, refers to the time which is needed until the sense amplifier 4 senses twice the current flowing in the bit line BL, and the read time is, e.g. about 20 to 30 μsec.

By contrast, according to the NAND flash memory of the present embodiment, the recovery time can be shortened. Specifically, in the case of the present embodiment, the voltage of the signal BLC that is applied to the gate electrode of the MOS transistor 5 by the BLC driver 6 is made variable, whereby the current drivability of the MOS transistor 5 can be enhanced. Therefore, the current Ibl flowing in the bit line BL(n+1) can be increased. Since the current Icbl becomes larger, it is possible to promote charging of the inter-line capacitance which corresponds to the potential difference occurring between the bit line BL and the bit line BL(n+1). Thereby, the recovery time can be shortened. FIG. 15 illustrates the decrease in recovery time, as well as the recovery time in the comparative example.

FIG. 15 shows, by comparison, the recovery time of the OFF cell ((A) in FIG. 15: the comparative example) in the case where the signal BLC is fixed at the voltage (Vtn+0.5 V), and the recovery time of the OFF cell ((B) in FIG. 15: the present embodiment) in the case where the signal BLC is fixed at the voltage (Vtn+0.6 V) only during the period Tover. The abscissa indicates the current Icell flowing in the bit line BL, and the ordinate indicates the recovery time.

As indicated by (A) in FIG. 15, the recovery time of the OFF cell of the comparative example is 11.2 μsec in the case where the current corresponding to the current Icell(OFF)min is 30 nA. On the other hand, as indicated by (B) in FIG. 15, the recovery time of the OFF cell of the present embodiment is about 9 μsec in the case where the current is 30 nA. Thus, compared to the recovery time of the OFF cell of the comparative example, the recovery time of the OFF cell of the present embodiment can be made shorter by even about 2.2 μsec.

FIG. 15 also shows the recovery time of the ON cell in the case where the signal BLC is set at the voltage (Vtn+0.6 V) only during the period Tover. For example, as indicated by (C) in FIG. 15, the recovery time of the ON cell of the present embodiment is about 6.5 μsec in the case where the current is 70 nA. As has been described with reference to FIG. 3, in the case where the cell characteristics has such current distribution that the current Icell(OFF)max flowing in the OFF cell is 30 nA and the current Icell(ON)min flowing in the ON cell is 70 nA, if the current Itrip is 50 nA, the recovery time of the ON cell is shorter than the recovery time of the OFF cell in the comparative example and the recovery time of the OFF cell in the present embodiment. Thus, in the NAND flash memory according to the present embodiment, in order to execute the second sense, a wait time of about 9 μsec should better be provided for the bit line BL with respect to which the OFF cell has been read by the sense amplifier 4 in the first sense.

In the meantime, the current Itrip for determining the ON cell/OFF cell is the current flowing to the gate electrode of the MOS transistor 26 that is in the ON state, and is an intermediate value between the maximum value of the current flowing in the OFF cell and the minimum value of the current flowing in the ON cell.

Second Embodiment

Next, a semiconductor memory device according to a second embodiment of the present invention will now be described. In the second embodiment, like the first embodiment, a NAND flash memory is described by way of example. In the present embodiment, the first embodiment is applied to the memory cell transistor MT which has a smaller ON/OFF ratio than in the above-described first embodiment in FIG. 3. Specifically, a description is given of recovery times in the case where the characteristics of the memory cell transistor MT are poorer than in the first embodiment. Only differences from the first embodiment are described.

FIG. 16 shows a distribution of current flowing in the memory cell transistor MT. In FIG. 16, the abscissa indicates the current distribution, and the ordinate indicates the probability of presence of the memory cell transistor MT. As shown in FIG. 16, in the characteristics of the memory cell transistor MT, the current Icell(ON)min of the ON cell is 50 nA, and the current Icell(OFF)max of the OFF cell is 30 nA. At this time, the current Itrip flowing to the gate electrode of the MOS transistor 26 that is in the ON state, that is, the current "Read Level", is set at an intermediate value between the current Icell(ON)min and the current Icell(OFF)max. Specifically, the current Itrip is set at, e.g. 40 nA.

The voltage of the signal BLC, which is applied to the gate electrode of the MOS transistor 5 by the BLC driver 6, the period Tover thereof, and the operation of the BLC driver 6 are the same as described above, and a description thereof is omitted here.

Advantageous Effect of the Present Embodiment

As has been described above, according to the NAND flash memory of the second embodiment, the following advantageous effect (2) is obtained.

(2) The Read Time can be Shortened (Part 2).

In the case of the NAND flash memory according to the present embodiment, even in the memory cell transistor MT having the characteristics shown in FIG. 16, the recovery time of the OFF cell can be decreased.

Referring to FIG. 17, a description is given of the recovery time of the NAND flash memory according to the present embodiment. In FIG. 17, the abscissa indicates the current Icell flowing in the bit line BL, and the ordinate indicates the recovery time. In FIG. 17, (A) indicates a comparative example in the case where the signal BLC at the time of the read operation is set at a fixed voltage (Vtn+0.5 V). In FIG. 17, (B) and (C) indicate recovery times of the ON cell and OFF cell in the present embodiment. In FIG. 17, (B) and (C) are examples in the case where the signal BLC in the period Tover is set at the voltage (Vtn+0.6 V), and the period Tover is set at 4 μsec.

As indicated by (A) in FIG. 17, the recovery time of the OFF cell of the bit line BL(n+1) in the comparative example is 14.8 μsec in the case where the current corresponding to the current Icell(OFF)min is 30 nA. On the other hand, as indicated by (B) in FIG. 17, the recovery time of the OFF cell of the bit line BL(n+1) in the present embodiment is 12.6 μsec in the case where the current is 30 nA. In short, compared to the recovery time of the OFF cell of the comparative example, the recovery time of the OFF cell of the present embodiment can be made shorter by even about 2.2 μsec.

In addition, as indicated by (C) in FIG. 17, the recovery time of the bit line BL(n+1), which is determined to be in the ON state in the present embodiment, is about 9.5 μsec in the case where the current is 70 nA. In the case where the cell characteristics has such current distribution that the current Icell(OFF)max is 30 nA and the current Icell(ON)min is 50 nA, if the current Itrip is 40 nA, the recovery time of the ON cell is shorter than the recovery time of the OFF cell in the comparative example and the recovery time of the OFF cell in the present embodiment. Thus, in the NAND flash memory according to the present embodiment, in order to execute the second sense, a wait time of about 12.6 μsec should better be provided for the bit line BL with respect to which the OFF cell or ON cell has been read by the sense amplifier 4 in the first sense.

Third Embodiment

Next, a semiconductor memory device according to a third embodiment of the present invention is described. In the third embodiment, like the first and second embodiments, a NAND flash memory is described by way of example. In the present embodiment, only differences from the first and second embodiments are described.

In the present embodiment, in FIG. 9 that has been described in connection with the first embodiment, the period Tover of the signal BLC, which is supplied by the BLC driver 6 to the gate electrode of the MOS transistor 5, is 5 μsec or 3 μsec. In other words, the period Tover is made shorter or longer than in the first and second embodiments. The characteristics of the memory cell transistor MT in the present embodiment are the same as in the case of FIG. 16 that has been described in connection with the second embodiment. In addition, like the first and second embodiments, after the first sense, the voltage (Vtn+0.6 V) is applied to the gate electrode of the MOS transistor 5 only during the period Tover.

Advantageous Effect of the Present Embodiment

As has been described above, according to the NAND flash memory of the third embodiment, the following advantageous effect (3) or (4) is obtained.

(3) The Read Time can be Shortened and the Power Consumption can be Reduced.

In the case of the NAND flash memory according to the present embodiment, even in the case where the period Tover of the signal BLC is set at 3 μsec, which is shorter than 4 μsec that has been described in the first and second embodiments, the recovery time of the memory cell transistor MT having the characteristics shown in FIG. 16 can be shortened.

Figure 18:
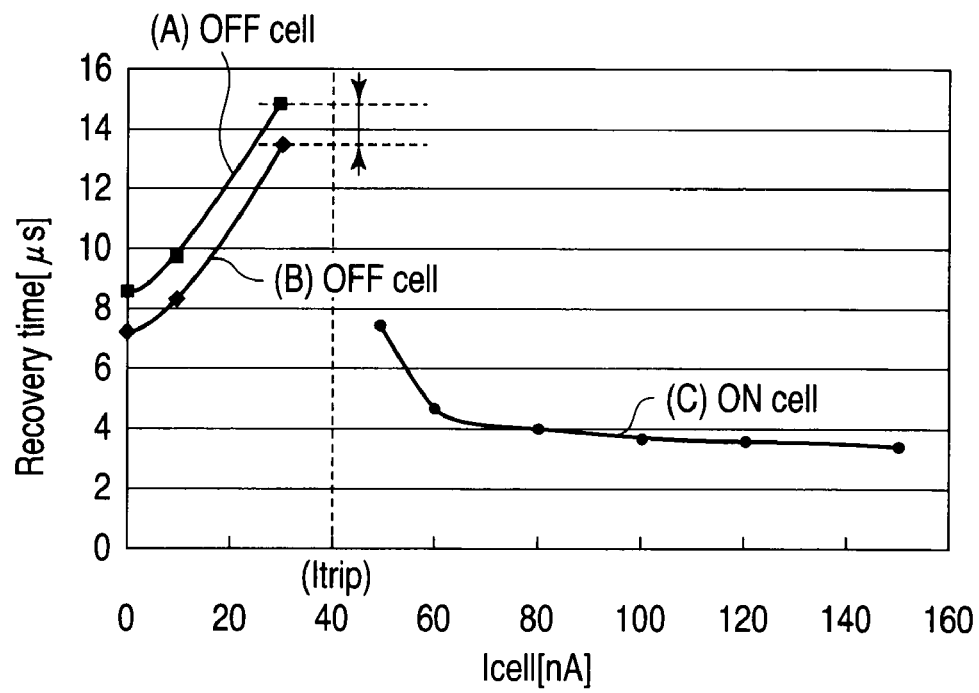
FIG. 18 is a view showing, by comparison, a recovery time in a NAND flash memory according to a third embodiment of the present invention.

Referring to FIG. 18, the recovery time of the NAND flash memory according to the present embodiment is described. In FIG. 18, the abscissa indicates the bit line current Ibl, and the ordinate indicates the recovery time. In FIG. 18, (A) indicates a comparative example in the case where the signal BLC at the time of the read operation is set at a fixed voltage (Vtn+0.5 V). In FIG. 18, (B) and (C) indicate recovery times of the ON cell and OFF cell in the present embodiment. In FIG. 18, (B) and (C) are examples in the case where the signal BLC in the period Tover is set at the voltage (Vtn+0.6 V), and the period Tover is set at 3 μsec.

Since (A) in FIG. 18, like (A) described in FIG. 17 of the second embodiment, is the memory cell transistor MT having the characteristics shown in FIG. 16, the recovery time is 14.8 μsec in the case where the current corresponding to the current Icell(OFF)max is 30 nA. On the other hand, as indicated by (B) in FIG. 18, the recovery time in the case where the period Tover, in which the voltage (Vtn+0.6 V) is applied to the signal BLC in the present embodiment, is set at 3 μsec, is about 13.5 μsec in the case where the current is 30 nA. In short, compared to the recovery time in the comparative example, the recovery time in the present embodiment can be made shorter by even about 1.3 μsec.

Furthermore, as indicated by (C) in FIG. 18, the recovery time of the ON cell of the bit line BL(n+1), which is determined to be in the ON state in the present embodiment, is about 7.3 μsec in the case where the current corresponding to the current Icell(ON)min is 50 nA.

As has been described above, the characteristics of the memory cell transistor MT in the present embodiment are poorer than the cell characteristics of the memory cell transistors MT in the first and second embodiments, and the period Tover in the present embodiment is 3 μsec which is shorter than 4 μsec. In the case of this example, however, the recover time can be made shorter than the recovery times shown as comparative examples in the first and second embodiments.

By decreasing the period Tover, in which the signal BLC is applied to the gate electrode of the MOS transistor 5, from 4 μsec to 3 μsec, the power consumption can be made lower than in the NAND flash memories of the first and second embodiments.

(4) The Read Time can be Shortened (Part 3).

In the case of the NAND flash memory according to the present embodiment, even in the case where the period Tover of the signal BLC is set at 5 μsec, the recovery time of the memory cell transistor MT having the characteristics shown in FIG. 16 can be shortened.

Figure 19:
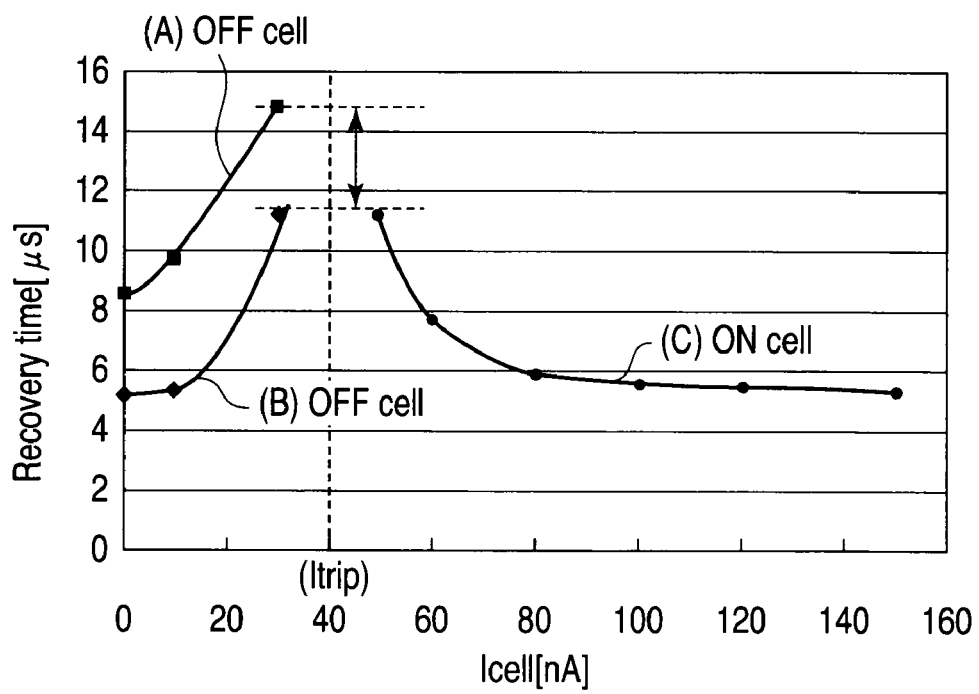
FIG. 19 is a view showing, by comparison, recovery times in NAND flash memories.

Referring to FIG. 19, a description is given of the recovery time of the NAND flash memory according to the present embodiment at the time when the period Tover is set at 5 μsec. In FIG. 19, the abscissa indicates the current Icell flowing in the bit line BL, and the ordinate indicates the recovery time. In FIG. 19, (A) indicates a comparative example in the case where the signal BLC at the time of the read operation is set at a fixed voltage (Vtn+0.5 V). In FIG. 19, (B) and (C) indicate recovery times of the ON cell and OFF cell in the present embodiment. In FIG. 19, (B) and (C) are examples in the case where the signal BLC in the period Tover is set at the voltage (Vtn+0.6 V).

Since (A) in FIG. 19, like (A) described in FIG. 17 of the second embodiment, is the memory cell transistor MT having the characteristics shown in FIG. 16, the recovery time is 14.8 μsec in the case where the current corresponding to the current Icell(OFF)max is 30 nA. On the other hand, as indicated by (B) in FIG. 19, the recovery time in the case where the period Tover, in which the voltage (Vtn+0.6 V) is applied to the signal BLC in the present embodiment, is set at 5 μsec, is about 11.3 μsec in the case where the current is 30 nA. In short, compared to the recovery time in the comparative example, the recovery time in the present embodiment can be made shorter by even about 3.5 μsec.

Furthermore, as indicated by (C) in FIG. 19, the recovery time of the bit line BL(n+1), which is determined to be in the ON state in the present embodiment, is about 11.3 μsec in the case where the current corresponding to the current Icell (OFF)min is 50 nA. Even if the cell characteristics of the memory cell transistor MT in the present embodiment are poorer than the cell characteristics of the memory cell transistors MT in the first and second embodiments, the period Tover of the voltage (Vtn+0.6 V), which is applied to the gate electrode of the MOS transistor 5, is 5 μsec and is long, and thus the recovery time of the ON cell is shorter than the recovery time of the OFF cell of the comparative example. However, since the period Tover is 5 μsec and long, the recovery time of the ON cell is longer than in the above-described first and second embodiments. Specifically, in the NAND flash memory of the present embodiment, it is necessary to execute the second sense after a wait of the recovery time of any one of the bit lines BL, which is determined to be in the ON state or OFF state by the sense amplifier 4. In short, in the NAND flash memory of the present embodiment, in order to execute the second sense, a wait time of about 11.8 μsec should better be provided for the bit line BL with respect to which the OFF cell or ON cell has been read by the sense amplifier 4 in the first sense.

In the present embodiment, if the period Tover is made longer than 5 μsec, the recovery time of the OFF cell indicated by (B) in FIG. 19 becomes still shorter, but there is a concern that the recovery time of the ON cell indicated by (C) in FIG. 19 becomes longer. The reason for this is that by the increase of the period Tover, the potential of the bit line BL(n+1), which is determined to be in the OFF state by the sense amplifier 4, quickly restores to the original voltage (0.5 V) from the temporarily lowered state due to the voltage drop of the bit line BLn. However, for the bit line BL that is determined to be the ON cell, more overcharge is executed as the period Tover becomes longer, and, as a result, the recovery time becomes longer. Specifically, in the case where the period Tover is set to be longer than 5 μsec, the second sense needs to be executed after the passing of the recovery time of the ON cell. Taking this into account, it is preferable to make the period Tover longer for the ON cell, and to make the period Tover shorter for the OFF cell. Preferably, as shown in FIG. 19, it is better to provide a period Tover which makes the recovery times of the ON cell and OFF cell substantially equal. In short, the period Tover should preferably be set at about 5 μsec.

Depending on cases, the above-described advantageous effect (1) or (2) may be expected in combination with the advantageous effect (3) or (4). Besides, all the advantageous effects (1) to (4) can be expected.

In the above description of the first to third embodiments, the case is exemplified in which the potential of the signal BLC in the period Tover is the voltage (Vtn+0.6 V) and the potential of the signal BLC at the other time of the read operation is the voltage (Vtn+0.5 V). However, the potentials of the signal BLC are not limited to these voltage values, and it should suffice if the potential of the signal BLC in the period Tover is higher than the potential in the other time of the read operation. In other words, it should suffice if the potential is set such that the current drivability of the MOS transistor 5 becomes higher in the period Tover than in the other period.

In the first to third embodiments, the read operation of the NAND flash memory has been described, but a similar operation can be executed at the time of verify. The difference between the program verify and erase verify is only the voltage that is applied to the word line WL.

The memory cell transistor MT, which is included in the NAND cell 7, may be a floating gate (FG) type. In the case of the FG type, the multi-layer gate includes a charge accumulation layer (a floating gate electrode: an electrically conductive layer) which is formed on a semiconductor substrate via a gate insulation film, and a control gate electrode which is formed on the floating gate electrode via an inter-gate insulation film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
  at least one memory cell which includes a charge accumulation layer and a control gate and is capable of storing data of two or more values in accordance threshold values;
  at least one bit line which is connected to the memory cell;
  at least one sense amplifier which senses identical data, which is stored in the memory cell, a plurality of number of times at a time of read;
  at least one n-channel metal oxide semiconductor (MOS) transistor which has a current path one end of which is connected to the sense amplifier and the other end of which is connected to the bit line; and
  at least one control unit which applies one of a first voltage and a second voltage, which is higher than the first voltage, to a gate electrode of the n-channel MOS transistor,
  wherein the control unit applies the first voltage to the gate electrode, thereby setting the n-channel MOS transistor in an ON state, and applies the second voltage to the gate electrode during a period after first sense and before second sense.

2. The semiconductor memory device according to claim 1, wherein the control unit varies the period during which the control unit applies the second voltage to the gate electrode, in accordance with a minimum value of a first current flowing in the bit line which is connected to the memory cell that is determined to be in an ON state by the sense amplifier, and a maximum value of a second current flowing in the bit line which is connected to the memory cell that is determined to be in an OFF state by the sense amplifier.

3. The semiconductor memory device according to claim 1, wherein the control unit determines the second voltage which is applied to the gate electrode, in accordance with a minimum value of a first current flowing in the bit line which is connected to the memory cell that is determined to be in an ON state by the sense amplifier, and a maximum value of a second current flowing in the bit line which is connected to the memory cell that is determined to be in an OFF state by the sense amplifier.

4. The semiconductor memory device according to claim 1, wherein the sense amplifier includes:
  one p-channel MOS transistor which has a current path one end of connected to an external power supply, and in which a first current flows in a gate thereof at a time of an ON state; and
  one latch circuit which is connected to the other end of the current path of the p-channel MOS transistor and stores "1" data when the p-channel MOS transistor is in the ON state and stores "0" data when the p-channel MOS transistor is in an OFF state,
  wherein at a time of a read operation, the second sense is executed for the bit line in which a second current flows in a case where the memory cell is determined to be in an ON state by the sense amplifier and in which a third current flows in a case where the memory cell is determined to be in an OFF state by the sense amplifier.

5. The semiconductor memory device according to claim 1, wherein the sense amplifier includes:
  one p-channel MOS transistor which has a current path one end of connected to an external power supply, and in which a first current flows in a gate thereof at a time of an ON state; and
  one latch circuit which is connected to the other end of the current path of the p-channel MOS transistor and stores "1" data when the p-channel MOS transistor is in the ON state and stores "0" data when the p-channel MOS transistor is in an OFF state,
  wherein at a time of a read operation, the second sense is executed, after passage of a longer one of a first period and a second period during which the second voltage is applied to the gate electrode by the control unit, for the bit line in which a second current flows in a case where the memory cell is determined to be in an ON state by the sense amplifier and in which a third current flows in a case where the memory cell is determined to be in an OFF state by the sense amplifier,
  the first period ends at a time point when the second current becomes higher than the first current, after the voltage that is applied to the gate electrode is switched from the second voltage to the first voltage, and
  the second period ends at a time point when the third current becomes lower than the first current, after the voltage that is applied to the gate electrode is switched from the second voltage to the first voltage.

6. The semiconductor memory device according to claim 1, wherein the sense amplifier includes:
   one p-channel MOS transistor which has a current path one end of connected to an external power supply, and in which a first current flows in a gate thereof at a time of an ON state; and
   one latch circuit which is connected to the other end of the current path of the p-channel MOS transistor and stores "1" data when the p-channel MOS transistor is in the ON state and stores "0" data when the p-channel MOS transistor is in an OFF state,
   wherein at a time of a verify operation, the second sense is executed for the bit line in which a second current flows in a case where the memory cell is determined to be in an ON state by the sense amplifier and in which a third current flows in a case where the memory cell is determined to be in an OFF state by the sense amplifier.

7. The semiconductor memory device according to claim 1, wherein the sense amplifier includes:
   one p-channel MOS transistor which has a current path one end of connected to an external power supply, and in which a first current flows in a gate thereof at a time of an ON state; and
   one latch circuit which is connected to the other end of the current path of the p-channel MOS transistor and stores "1" data when the p-channel MOS transistor is in the ON state and stores "0" data when the p-channel MOS transistor is in an OFF state,
   wherein at a time of a verify operation, the second sense is executed, after passage of a longer one of a first period and a second period during which the second voltage is applied to the gate electrode by the control unit, for the bit line in which a second current flows in a case where the memory cell is determined to be in an ON state by the sense amplifier and in which a third current flows in a case where the memory cell is determined to be in an OFF state by the sense amplifier,
   the first period ends at a time point when the second current becomes higher than the first current, after the voltage that is applied to the gate electrode is switched from the second voltage to the first voltage, and
   the second period ends at a time point when the third current becomes lower than the first current, after the voltage that is applied to the gate electrode is switched from the second voltage to the first voltage.

8. The semiconductor memory device according to claim 1, wherein the memory cell has a metal oxide nitride oxide semiconductor (MONOS) structure, and includes a charge accumulation layer which is formed on a semiconductor substrate via a gate insulation film, a block layer which is formed on the charge accumulation layer and has a higher dielectric constant than the charge accumulation layer, and a control gate electrode which is formed on the block layer.

9. The semiconductor memory device according to claim 1, wherein the memory cell is of a floating gate type, and has a multi-layer gate structure including a floating gate electrode which is formed on a semiconductor substrate via a gate insulation film, and a control gate electrode which is formed on the floating gate electrode via an inter-gate insulation film.

10. A semiconductor memory device comprising:
   a plurality of memory cells, each of which includes a charge accumulation layer and a control gate and is capable of storing data of two or more values in accordance threshold values;
   a plurality of bit lines which are connected to the plurality of memory cells;
   a plurality of sense amplifiers which are provided on the plurality of bit lines and sense identical data, which is stored in the plurality of memory cells, a plurality of number of times at a time of read;
   a plurality of n-channel metal oxide semiconductor (MOS) transistors, each of which has a current path one end of which is connected to an associated one of the plurality of sense amplifiers and the other end of which is connected to an associated one of the plurality of bit lines; and
   one control unit which applies one of a first voltage and a second voltage, which is higher than the first voltage, to gate electrodes of the plurality of n-channel MOS transistors,
   wherein at a time of a read operation or a verify operation the control unit applies the first voltage to the gate electrodes, thereby setting the plurality of n-channel MOS transistors in an ON state, and applies the second voltage to the gate electrodes during a period after first sense and before second sense.

11. The semiconductor memory device according to claim 10, wherein the control unit varies the period during which the control unit applies the second voltage to the gate electrodes, in accordance with a minimum value of a first current flowing in the plurality of bit lines which are connected to the plurality of memory cells that are determined to be in an ON state by the plurality of sense amplifiers, and a maximum value of a second current flowing in the plurality of bit lines which are connected to the plurality of memory cells that are determined to be in an OFF state by the plurality of sense amplifiers.

12. The semiconductor memory device according to claim 10, wherein the control unit determines the second voltage which is applied to the gate electrodes, in accordance with a minimum value of a first current flowing in the plurality of bit lines which are connected to the plurality of memory cells that are determined to be in an ON state by the plurality of sense amplifiers, and a maximum value of a second current flowing in the plurality of bit lines which are connected to the plurality of memory cells that are determined to be in an OFF state by the plurality of sense amplifiers.

13. The semiconductor memory device according to claim 10, wherein each of the plurality of sense amplifiers includes:
   one p-channel MOS transistor which has a current path one end of connected to an external power supply, and in which a first current flows in a gate thereof at a time of an ON state; and
   one latch circuit which is connected to the other end of the current path of the p-channel MOS transistor and stores "1" data when the p-channel MOS transistor is in the ON state and stores "0" data when the p-channel MOS transistor is in an OFF state,
   wherein at a time of a read operation, the second sense is executed for the plurality of bit lines in which a second current flows in a case where the associated memory cell is determined to be in an ON state by the sense amplifier and in which a third current flows in a case where the associated memory cell is determined to be in an OFF state by the sense amplifier.

14. The semiconductor memory device according to claim 10, wherein each of the plurality of sense amplifiers includes:
   one p-channel MOS transistor which has a current path one end of connected to an external power supply, and in which a first current flows in a gate thereof at a time of an ON state; and one latch circuit which is connected to the other end of the current path of the p-channel MOS transistor and stores "1" data when the p-channel MOS transistor is in the ON state and stores "0" data when the p-channel MOS transistor is in an OFF state, wherein at a time of a read operation, the second sense is executed, after passage of a longer one of a first period and a second period during which the second voltage is applied to the gate electrodes by the control unit, for the plurality of bit lines in which a second current flows in a case where the associated memory cell is determined to be in an ON state by the sense amplifier and in which a third current flows in a case where the associated memory cell is determined to be in an OFF state by the sense amplifier, the first period ends at a time point when the second current becomes higher than the first current, after the voltage that is applied to the gate electrode is switched from the second voltage to the first voltage, and the second period ends at a time point when the third current becomes lower than the first current, after the voltage that is applied to the gate electrode is switched from the second voltage to the first voltage.

15. The semiconductor memory device according to claim 10, wherein each of the plurality of memory cells has a metal oxide nitride oxide semiconductor (MONOS) structure, and includes a charge accumulation layer which is formed on a semiconductor substrate via a gate insulation film, a block layer which is formed on the charge accumulation layer and has a higher dielectric constant than the charge accumulation layer, and a control gate electrode which is formed on the block layer.

16. The semiconductor memory device according to claim 10, wherein each of the plurality of memory cells is of a floating gate type, and has a multi-layer gate structure including a floating gate electrode which is formed on a semiconductor substrate via a gate insulation film, and a control gate electrode which is formed on the floating gate electrode via an inter-gate insulation film.

* * * * *